United States Patent
Park et al.

(10) Patent No.: US 12,079,488 B2
(45) Date of Patent: Sep. 3, 2024

(54) MEMORY SYSTEM AND METHOD OF OPERATING THE SAME

(71) Applicant: Samsung Electronics Co., Ltd., Suwon-si (KR)

(72) Inventors: Jehyun Park, Suwon-si (KR); Kwanho Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 21 days.

(21) Appl. No.: 18/050,585

(22) Filed: Oct. 28, 2022

(65) Prior Publication Data

US 2023/0195327 A1     Jun. 22, 2023

(30) Foreign Application Priority Data

Dec. 22, 2021   (KR) ........................ 10-2021-0184903

(51) Int. Cl.
    *G06F 12/00*          (2006.01)
    *G06F 3/06*           (2006.01)
    (Continued)

(52) U.S. Cl.
    CPC .......... *G06F 3/0619* (2013.01); *G06F 3/0653* (2013.01); *G06F 3/0673* (2013.01);
    (Continued)

(58) Field of Classification Search
    CPC .... G06F 3/0619; G06F 3/0653; G06F 3/0673; G06F 11/0751; G06F 11/0772; G06F 11/1048; G11C 29/42
    See application file for complete search history.

(56) References Cited

U.S. PATENT DOCUMENTS 8,576,622 B2    11/2013   Yoon et al.
9,959,164 B2    5/2018    Park
               (Continued)

FOREIGN PATENT DOCUMENTS

CN      102479556 A     5/2012
JP       H0991206 A      4/1997
           (Continued)

OTHER PUBLICATIONS

Extended European Search Report corresponding to EP 22212081. 8; Dated: Apr. 13, 2023 (8 pages).

*Primary Examiner* — John A Lane
(74) *Attorney, Agent, or Firm* — Myers Bigel, P.A.

(57) ABSTRACT

A memory system includes a semiconductor memory device and a memory controller configured to control the semiconductor memory device. The semiconductor memory device includes a memory cell array including a plurality of memory cells configured to store data, a refresh controller configured to control a refresh operation with respect to the plurality of memory cells, and an error monitoring circuit configured to generate error information by monitoring an error in the data stored in the memory cell array based on refresh sensing data provided from the memory cell array during the refresh operation. The memory controller includes an error correction code (ECC) circuit and is further configured to correct the error in the data stored in the memory cell array using the ECC circuit based on the error information.

20 Claims, 26 Drawing Sheets

(51) Int. Cl.
  *G06F 11/07* (2006.01)
  *G06F 11/10* (2006.01)
  *G11C 29/42* (2006.01)
(52) U.S. Cl.
  CPC ...... *G06F 11/0751* (2013.01); *G06F 11/0772* (2013.01); *G06F 11/1048* (2013.01); *G11C 29/42* (2013.01)

(56) References Cited

U.S. PATENT DOCUMENTS

| | | | |
|---|---|---|---|
| 10,268,541 B2 | 4/2019 | Niu et al. |
| 10,394,648 B2 | 8/2019 | Niu et al. |
| 10,445,177 B2 | 10/2019 | Reed et al. |
| 10,599,504 B1 | 3/2020 | Beserra et al. |
| 10,795,764 B2 | 10/2020 | Niu et al. |
| 10,803,919 B2 | 10/2020 | Kim et al. |
| 10,908,993 B2 | 2/2021 | Niu et al. |
| 10,977,118 B2 | 4/2021 | Niu et al. |
| 11,010,242 B2 | 5/2021 | Niu et al. |
| 2002/0199151 A1 | 12/2002 | Zuraski |
| 2009/0193301 A1* | 7/2009 | Ito ............ G11C 11/406 714/763 |
| 2014/0092698 A1* | 4/2014 | Kim ............ G11C 11/34 365/222 |
| 2017/0139641 A1 | 5/2017 | Cha et al. |
| 2018/0130526 A1* | 5/2018 | Hong ............ G11C 13/0069 |
| 2020/0192754 A1 | 6/2020 | Cho et al. |
| 2020/0210278 A1 | 7/2020 | Rooney et al. |
| 2020/0210279 A1 | 7/2020 | Parry et al. |
| 2021/0064462 A1* | 3/2021 | Eun ............ G11C 29/4401 |
| 2021/0142860 A1 | 5/2021 | Song et al. |
| 2021/0286670 A1 | 9/2021 | Rooney et al. |
| 2021/0294697 A1 | 9/2021 | Niu et al. |

FOREIGN PATENT DOCUMENTS

| | | |
|---|---|---|
| JP | 2020071589 A | 5/2020 |
| KR | 102191223 B1 | 12/2020 |
| KR | 102274593 B1 | 7/2021 |
| TW | 583541 B | 4/2004 |

* cited by examiner

| DATA BITS | PARITY BITS | | | PARITY O/H | | |
|---|---|---|---|---|---|---|
| | SEC | SEC-DED | DEC | SEC | SEC-DED | DEC |
| 8 | 4 | 5 | 8 | 50.0% | 62.5% | 100% |
| 64 | 7 | 8 | 14 | 10.9% | 12.5% | 21.9% |
| 128 | 8 | 9 | 16 | 6.3% | 7.0% | 12.5% |
| 256 | 9 | 10 | 18 | 3.5% | 3.9% | 7.0% |
| 512 | 10 | 11 | 20 | 2.0% | 2.1% | 3.9% |

MEMORY SYSTEM AND METHOD OF OPERATING THE SAME

CROSS-REFERENCE TO RELATED APPLICATION

This U.S. non-provisional application claims priority under 35 USC § 119 to Korean Patent Application No. 10-2021-0184903, filed on Dec. 22, 2021, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to a memory system and a method of operating the memory system.

2. Discussion of the Related Art

Semiconductor memory devices for storing data may be classified into volatile memory devices and non-volatile memory devices. Volatile memory devices, such as dynamic random access memory (DRAM) devices, store data by charging or discharging capacitors in memory cells, and lose the stored data when power is off. Non-volatile memory devices, such as flash memory devices, maintain stored data even when power is off. Volatile memory devices are widely used as main memories of various apparatuses, and non-volatile memory devices are widely used for storing program code and/or data in various electronic devices, e.g., computers, mobile devices, etc.

In volatile memory devices, cell charges stored in a memory cell may be lost due to a leakage current. In addition, when a wordline is transitioned frequently between an active state and a precharged state (e.g., when the wordline has been accessed intensively or frequently), a memory cell connected to a wordline that is adjacent to the frequently accessed wordline may be affected and lose stored charges, potentially causing data loss. Charges stored in a memory cell may be maintained by recharging before data is lost due to leakage of the charges. Such recharge of cell charges is referred to as a refresh operation, and a refresh operation may be performed repeatedly before cell charges are significantly lost.

Errors may occur in data stored in memory cells due to charge leakage of the memory cells, errors in write operations, and so on. An error correction code (ECC) scheme may be performed to correct the errors and restore the original data. However there is a limit to the correction capability of the ECC scheme as the error correction may become impossible as the number of errors increases, and the data stored in the volatile memory may be lost. The manufacturing process scale may be lowered to increase integration degree in volatile memory devices. Due to the continuing shrinkage in the manufacturing process scale for volatile memory devices, bit error rate in the volatile memory cells may rapidly increase and yield of volatile memory devices may be lowered.

SUMMARY

Some example embodiments may provide a memory system and a method of operating a memory system, which are capable of correcting errors in data stored in a volatile memory device.

According to example embodiments, a memory system includes a semiconductor memory device and a memory controller configured to control the semiconductor memory device. The semiconductor memory device includes a memory cell array including a plurality of memory cells configured to store data, a refresh controller configured to control a refresh operation with respect to the plurality of memory cells and an error monitoring circuit configured to generate error information by monitoring an error in the data stored in the memory cell array based on refresh sensing data provided from the memory cell array during the refresh operation. The memory controller includes an error correction code (ECC) circuit and is configured to correct the error in the data stored in the memory cell array using the ECC circuit based on the error information.

According to example embodiments, a method of operating a memory system including a semiconductor memory device and a memory controller configured to control the semiconductor memory device, includes, performing a refresh operation with respect to a plurality of memory cells included in a memory cell array of the semiconductor memory device, generating, in the semiconductor memory device, error information by monitoring an error in data stored in the memory cell array based on refresh sensing data provided from the memory cell array during the refresh operation, providing the error information from the semiconductor memory device to the memory controller, and correcting the error in the data stored in the memory cell array using an error correction code (ECC) circuit included in the memory controller based on the error information.

According to example embodiments, a memory system includes a semiconductor memory device comprising a memory cell array including a plurality of memory cells configured to store data, and a host device comprising a processor and a memory controller configured to control the semiconductor memory device. The semiconductor memory device is configured to generate an interrupt signal and a fail address by monitoring an error in the data stored in the memory cell array based on refresh sensing data provided from the memory cell array during a refresh operation, such that the interrupt signal indicates whether the error occurred in the data stored in the memory cell array and the fail address indicates a location of the error in the data stored in the memory cell array. The host device includes an error correction code (ECC) circuit, and the host device is configured to correct the error in the data stored in the memory cell array using the ECC circuit based on the error information.

The memory system and the method of operating the memory system according to example embodiments may remove the patrol read operation accompanied with memory scrubbing by generating the error information in the semiconductor memory device based on the refresh sensing data that is provided during the refresh operation and performing the error correction by the memory controller based on the error information. Through the removal of the patrol read operation, the power consumption of the memory system may be reduced and reliability and performance of the memory system may be enhanced.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
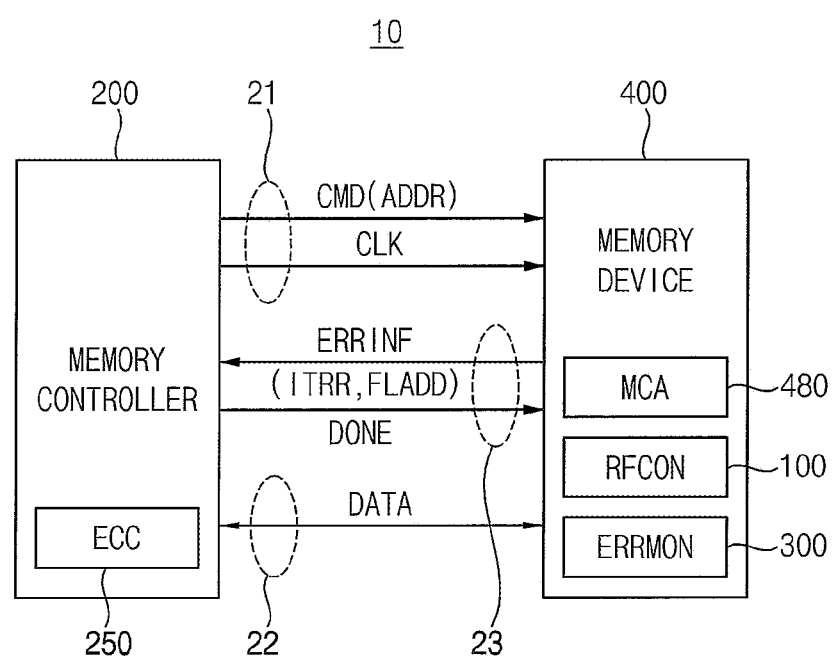
FIG. 1 is a block diagram illustrating a memory system according to example embodiments.

Various example embodiments will be described more fully hereinafter with reference to the accompanying drawings, in which some example embodiments are shown. The present inventive subject matter may, however, be embodied in many different forms and should not be construed as limited to the embodiments set forth herein. In the drawings, like numerals refer to like elements throughout the description and repeated descriptions may be omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 2:
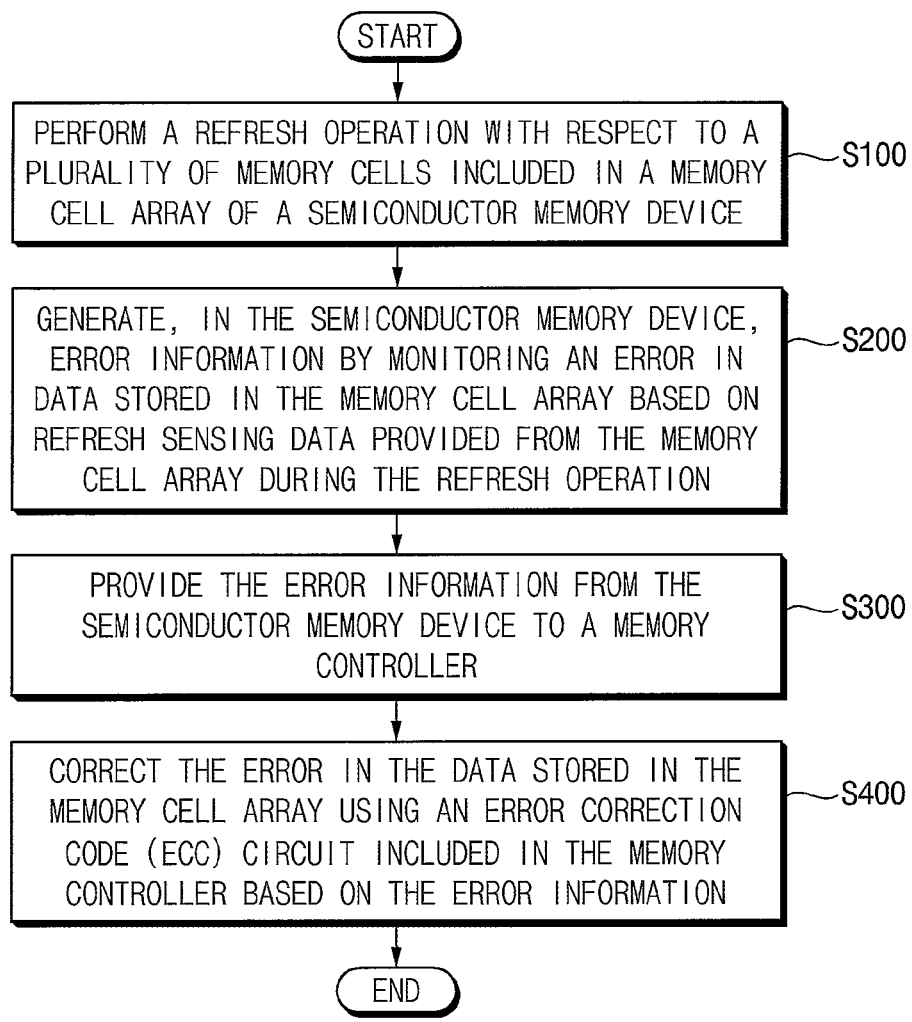
FIG. 2 is a flowchart illustrating a method of operating a memory system according to example embodiments.

FIG. 1 is a block diagram illustrating a memory system according to example embodiments, and FIG. 2 is a flowchart illustrating a method of operating a memory system according to example embodiments.

Referring to FIG. 1, a memory system 10 may include a memory controller 200 and a semiconductor memory device 400. The memory controller 200 and the semiconductor memory device 400 may communicate through a main interface and a side-band interface. The main interface may include a control bus 21 for transferring a command CMD, an address ADDR, a clock signal CLK, etc., and a data bus 22 for transferring data, between the memory controller 200 and the semiconductor memory device 400. The side-band interface may include an additional bus 23 for transferring error information ERRINF, a correction done signal DONE, etc. between the memory controller 200 and an error monitoring circuit 300. The side-band interface may operate independently of the main interface. In some example embodiments, the side-band interface may conform to the IEEE1500 standard.

According to some standards for memory devices, the address ADDR may be incorporated in the command CMD. The memory controller 200 may generate the command CMD to control the memory device 400, and the data may be written to or read from the semiconductor memory device 400 under the control of the memory controller 200.

The memory controller 200 may include an error correction code (ECC) circuit 250. The ECC circuit 250 may be configured to encode data to be written in the semiconductor memory device 400 to provide write data. In addition, the ECC circuit 250 may be configured to decode read data transferred from the semiconductor memory device 400 to check and correct errors in the read data. When the errors in the read data are uncorrectable, the memory controller 200 may be configured to take appropriate steps such as resetting of the semiconductor memory device 400.

The semiconductor memory device 400 may include a memory cell array MCA 480 including a plurality of memory cells configured to store data, a refresh controller RFCON 100 configured to control a refresh operation with respect to the plurality of memory cells, and an error monitoring circuit ERRMON 300. The configuration and the operation of the semiconductor memory device 400, according to some embodiments, will be further described below with reference to FIGS. 3A and 3B.

Referring to FIGS. 1 and 2, a refresh operation may be performed with respect to a plurality of memory cells included in the memory cell array 480 of the semiconductor memory device 400, under control of the refresh controller 100 (S100).

In the semiconductor memory device 400, error information ERRINF may be generated by monitoring an error in a data stored in the memory cell array 480 based on refresh sensing data provided from the memory cell array 480 during the refresh operation (S200), and the error information ERRINF may be provided from the semiconductor memory device 400 to the memory controller 200 (S300).

The memory controller 200 may correct the error in the data stored in the memory cell array 480 using the ECC circuit 250 based on the error information ERRINF (S400).

As will be described below, the error information ERRINF may include an interrupt signal ITRR and a fail address FLADD. The interrupt signal ITRR may indicate whether the error occurred in the data stored in the memory cell array 480. The fail address FLADD may indicate a location of the error in the data stored in the memory cell array 480, i.e., an address in the memory where the data having the error is located.

In some example embodiments, the memory controller 200 may access the error monitoring circuit 300 and receive the fail address FLADD responsive to activation of the interrupt signal ITRR. The memory controller 200 may read the data including the error from the memory cell array 480 based on the fail address FLADD. The memory controller 200 may generate corrected data by correcting the data including the error using the ECC circuit 250, and write the corrected data in the memory cell array 480 based on the fail address FLADD. The memory controller 200 may provide a correction done signal DONE to the error monitoring circuit 300 in the semiconductor memory device 400. The correction done signal DONE may indicate that error correction of the data stored in the fail address FLADD of the memory cell array 480 is completed. The memory controller 200 may activate the correction done signal DONE when the error correction is completed.

As such, the memory system 10 and the method of operating the memory system 10, according to example embodiments, may remove the patrol read operation accompanied with memory scrubbing, by generating the error information ERRINF in the semiconductor memory device 400 based on the refresh sensing data that is provided during the refresh operation and performing the error correction by the memory controller 200 based on the error information ERRINF. Through the removal of the patrol read operation, the power consumption of the memory system 10 may be reduced and reliability and performance of the memory system 10 may be enhanced.

Figure 3A:
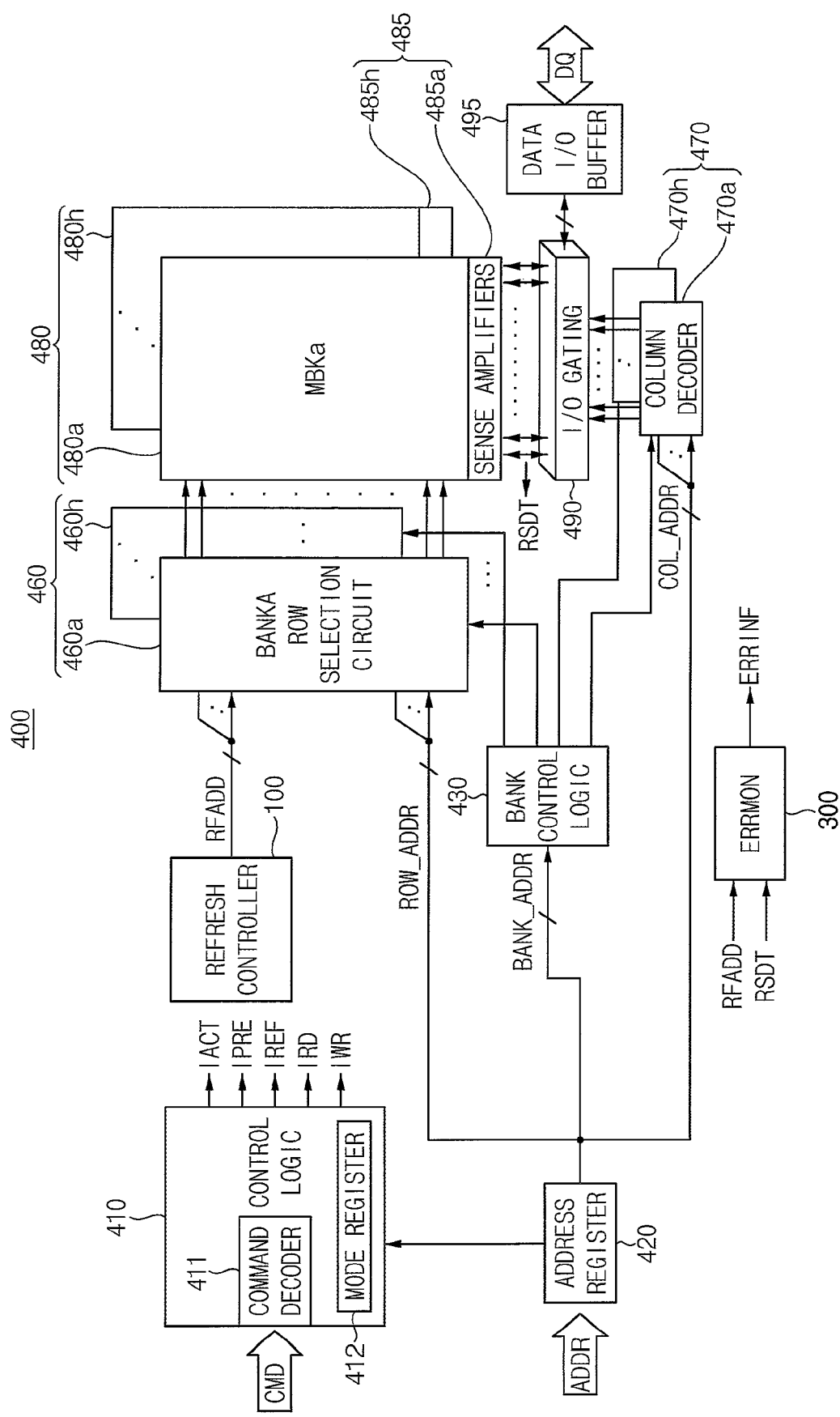
FIG. 3A is a block diagram illustrating a semiconductor memory device according to example embodiments.

FIG. 3A is a block diagram illustrating a semiconductor memory device according to example embodiments.

Referring to FIG. 3A, a semiconductor memory device 400 may include a command control logic 410, an address register 420, a bank control logic 430, a row selection circuit 460 (or row decoder), a column decoder 470, a memory cell array 480, a sense amplifier unit 485, an input/output (I/O) gating circuit 490, a data input/output (I/O) buffer 495, a refresh controller 100, and an error monitoring circuit ERRMON 300.

The memory cell array 480 may include a plurality of bank arrays 480a, ..., 480h. The row selection circuit 460 may include a plurality of bank row selection circuits 460a, ..., 460h respectively coupled to the bank arrays 480a, ..., 480h. The column decoder 470 may include a plurality of bank column decoders 470a, ..., 470h respectively coupled to the bank arrays 480a, ..., 480h. The sense amplifier unit 485 may include a plurality of bank sense amplifiers 485a, ..., 485h respectively coupled to the bank arrays 480a, ..., 480h.

The address register 420 may be configured to receive an address ADDR including a bank address BANK_ADDR, a row address ROW_ADDR, and a column address COL_ADDR from the memory controller 200. The address register 420 may be configured to provide the received bank address BANK_ADDR to the bank control logic 430, may be configured to provide the received row address ROW_ADDR to the row selection circuit 460, and may be configured to provide the received column address COL_ADDR to the column decoder 470.

The bank control logic 430 may be configured to generate bank control signals in response to the bank address BANK_ADDR. One of the bank row selection circuits 460a, ..., 460h corresponding to the bank address BANK_ADDR may be activated in response to the bank control signals, and one of the bank column decoders 470a, ..., 470h corresponding to the bank address BANK_ADDR may be activated in response to the bank control signals.

The row address ROW_ADDR from the address register 420 may be applied to the bank row selection circuits 460a, ..., 460h. The activated one of the bank row selection circuits 460a, ..., 460h may be configured to decode the row address ROW_ADDR, and may be configured to activate a wordline corresponding to the row address ROW_ADDR. For example, the activated bank row selection circuit 460 may be configured to apply a wordline driving voltage to the wordline corresponding to the row address ROW_ADDR.

The column decoder 470 may include a column address latch. The column address latch may be configured to receive the column address COL_ADDR from the address register 420, and may be configured to temporarily store the received column address COL_ADDR. In some example embodiments, in a burst mode, the column address latch may be configured to generate column addresses that increment from the received column address COL_ADDR. The column address latch may apply the temporarily stored or generated column address to the bank column decoders 470a, ..., 470h.

The activated one of the bank column decoders 470a, ..., 470h may decode the column address COL_ADDR, and may control the I/O gating circuit 490 to output data corresponding to the column address COL_ADDR.

The I/O gating circuit 490 may include circuitry for gating input/output data. The I/O gating circuit 490 may further include read data latches for storing data that is output from the bank arrays 480a, ..., 480h, and write drivers for writing data to the bank arrays 480a, ..., 480h.

Data to be read from one bank array of the bank arrays 480a, ..., 480h may be sensed by one of the bank sense amplifiers 485a, ..., 485h coupled to the one bank array from which the data is to be read, and may be stored in the read data latches. The data stored in the read data latches may be provided to the memory controller 200 via the data I/O buffer 495. Data DQ to be written in one bank array of the bank arrays 480a, ..., 480h may be provided to the data I/O buffer 495 from the memory controller 200. The write driver may be configured to write the data DQ in one bank array of the bank arrays 480a, ..., 480h.

The command control logic 410 may control operations of the memory device 400. For example, the command control logic 410 may generate control signals for the memory device 400 to perform a write operation, a read operation, or a refresh operation. The command control logic 410 may be configured to generate internal command signals, such as an active signal TACT, a precharge signal IPRE, a refresh signal IREF, a read signal IRD, a write signal IWR, etc., based on commands CMD transferred from the memory controller 200 in FIG. 1. The command control logic 410 may include a command decoder 411 that decodes the commands CMD received from the memory controller 200 and a mode register set 412 that sets an operation mode of the memory device 400.

Although FIG. 3A illustrates the command control logic 410 and the address register 420 as being distinct from each other, the command control logic 410 and the address register 420 may be implemented as a single, monolithic integrated circuit. In addition, although FIG. 3A illustrates the command CMD and the address ADDR being provided as distinct signals, the command CMD and the address ADDR may be provided as combined signals, e.g., as specified by DDR5, HBM and LPDDR5 standards.

The refresh controller 100 may be configured to control the refresh operation with respect to the memory cells included in the memory cell array 480, and may be configured to generate a refresh address RFADD indicating the location where the refresh operation is performed in the memory cell array 480. The refresh controller 100 and the refresh operation, according to some embodiments, will be further described with reference to FIGS. 13, 14 and 15.

The error monitoring circuit 300 may be configured to generate the error information ERRINF by monitoring the error in the data stored in the memory cell array 480 based on the refresh sensing data RSDT provided from the memory cell array 480 during the refresh operation. The configuration and the operation of the error monitoring circuit 300, according to some embodiments, will be further described with reference to FIG. 7, and so on. As will be described below, the error information ERRINF may include the interrupt signal ITRR indicating whether the error occurred in the data stored in the memory cell array 480, and the fail address FLADD indicating the location of the error in the data stored in the memory cell array 480, i.e., an address in the memory where the data having the error is located.

The refresh sensing data RSDT provided during the refresh operation may be differentiated from the read data provided during the read operation. The refresh sensing data RSDT may be provided to the error monitoring circuit 300 included in semiconductor memory device 400. In contrast, the read data may be provided to the memory controller via the data I/O buffer 495. The error monitoring circuit 300 may be directly connected to the sense amplifier unit 485, or connected to the data I/O buffer 495, to receive the refresh sensing data RSDT. In addition, the error monitoring circuit 300 may be configured to receive the refresh address RFADD from the refresh controller 100.

Figure 3B:
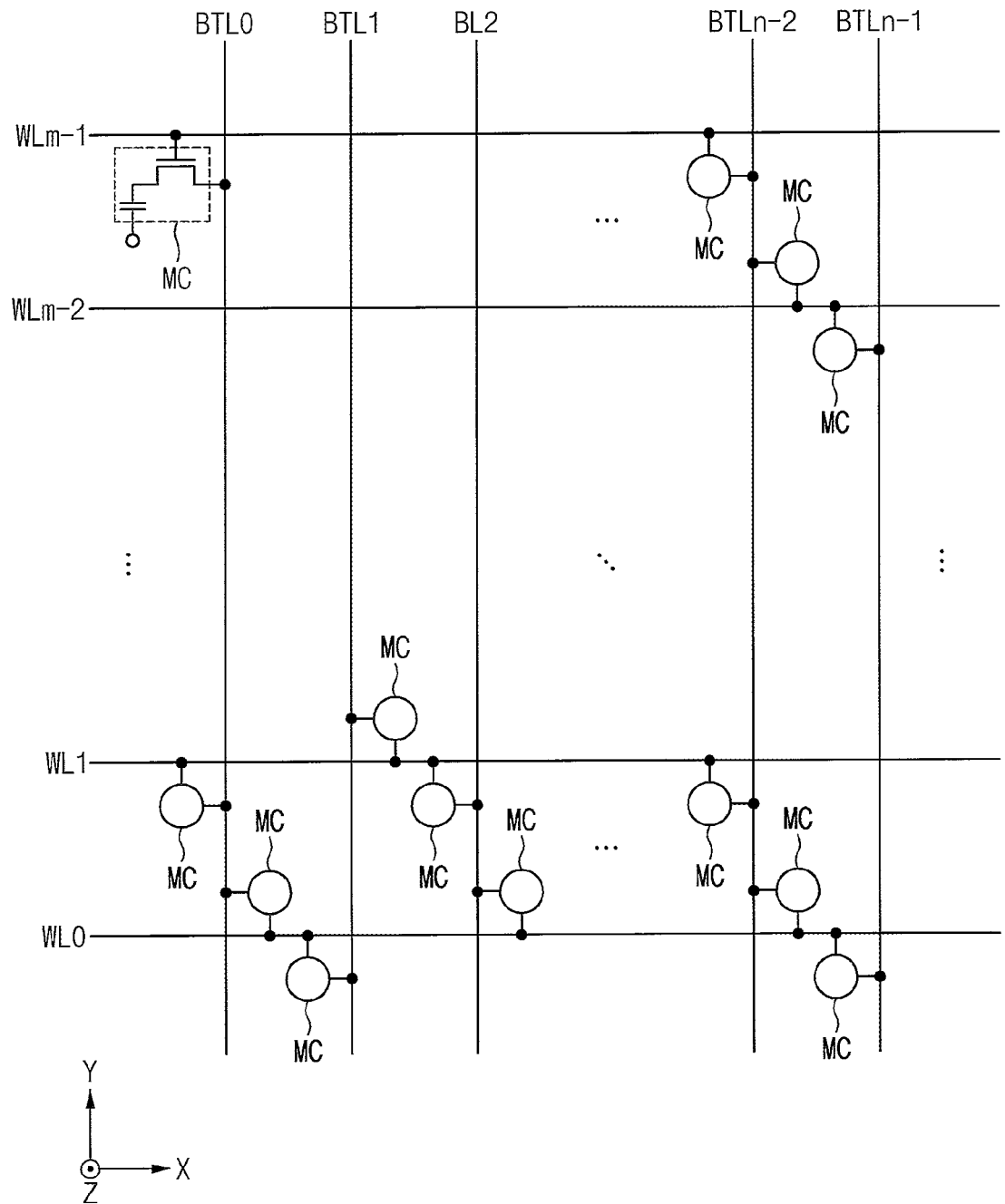
FIG. 3B is a diagram illustrating a bank array included in the semiconductor memory device of FIG. 3A.

FIG. 3B is a diagram illustrating a bank array included in the semiconductor memory device of FIG. 3A. The first bank arrays 480a may be representative of the first through eighth bank arrays 480a to 480h in FIG. 3A.

Referring to FIG. 3B, the first bank array 480a may include a plurality of wordlines WL0~WLm−1, where m is an even integer equal to or greater than two, a plurality of bitlines BTL0~BTLn−1, where n is an even integer equal to or greater than two, and a plurality of memory cells MC disposed at intersections between the wordlines WL0~WLm−1 and the bitlines BTL0~BTLn−1.

In some example embodiments, each of the memory cells MC may include a DRAM cell. The arrangement of the plurality of memory cells MC may differ based on whether a memory cell MC is coupled to an even wordline (for example, wordline WL0) or to an odd wordline (for example, wordline WL1). For example, a bitline coupled to adjacent memory cells MC may be selected based on whether a wordline selected by an access address is an even wordline or an odd wordline.

Figure 4A:
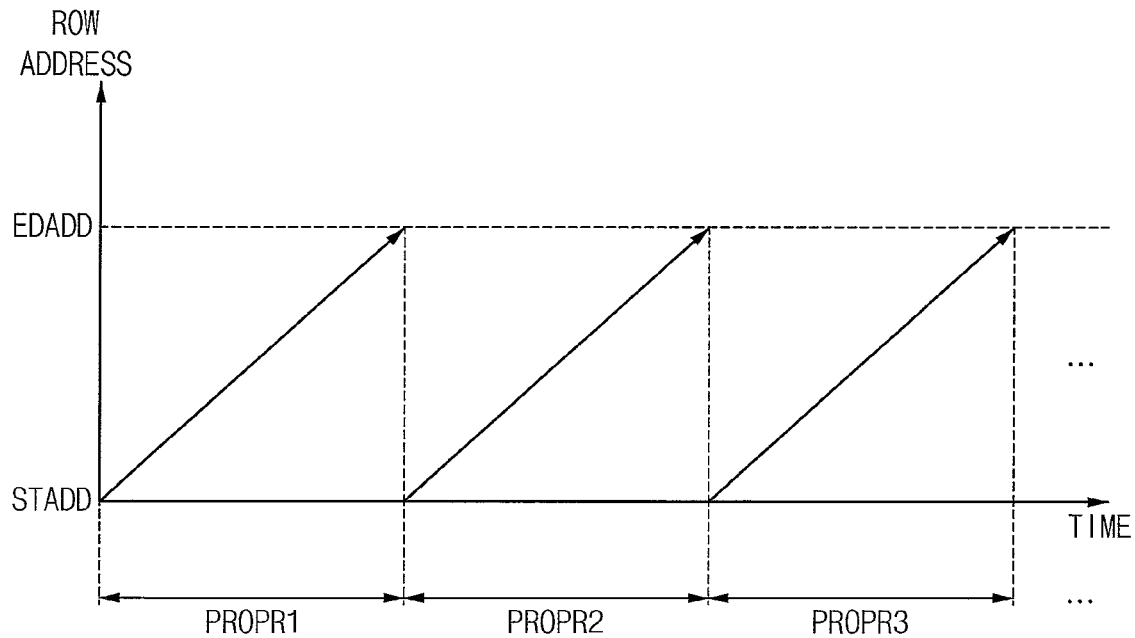
FIGS. 4A and 4B are diagrams illustrating a patrol read operation for correcting errors in data stored in a semiconductor memory device.
Figure 4B:
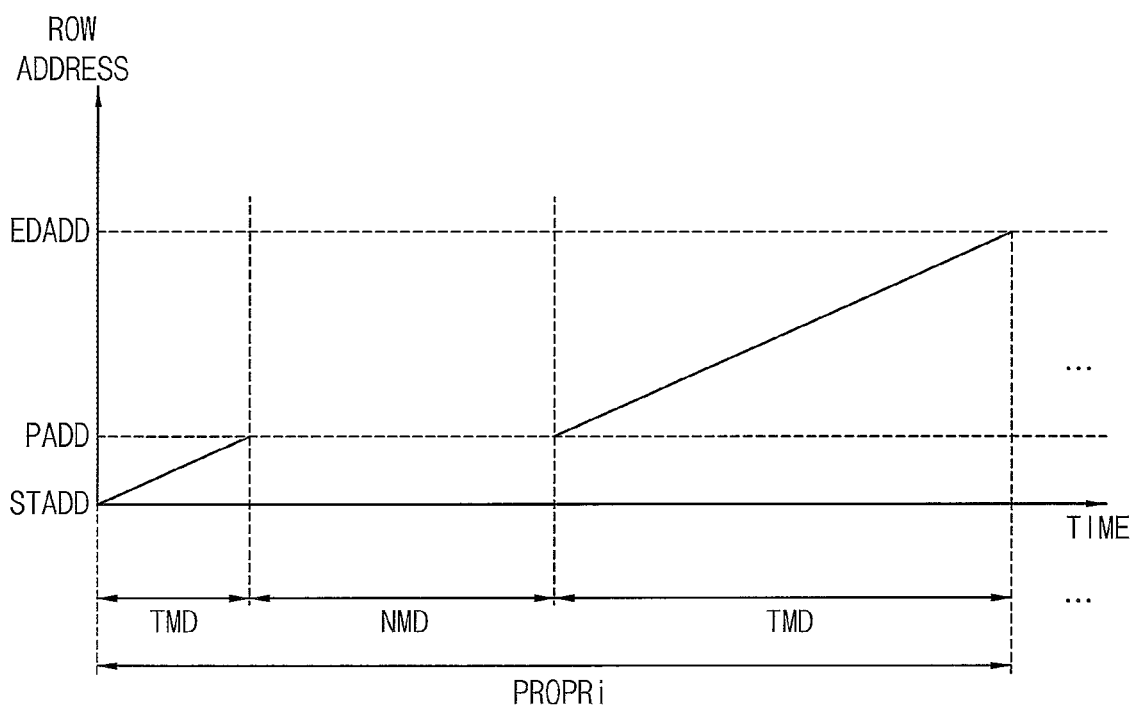

FIGS. 4A and 4B are diagrams illustrating a patrol read operation for correcting errors in data stored in a semiconductor memory device.

A patrol read operation for memory scrubbing may be performed regardless of an access read operation (or, a normal read operation) to provide data read from the semiconductor memory device to an external device. The patrol read operation may be performed repeatedly with respect to entire row addresses of the semiconductor memory device.

Referring to FIGS. 4A and 4B, a plurality of periods of patrol read operations PROPR1, PROPR2 and PROPR3 may be sequential. A patrol read operation may be performed during each period of the patrol read operations PROPR1, PROPR2 and PROPR3. For example, a patrol read operation may be performed from a start row address STADD to an end row address EDADD of entire row addresses of the semiconductor memory device during each period of patrol read operations PROPR1, PROPR2 and PROPR3. FIG. 4A illustrates a non-limiting example in which the plurality of periods of patrol read operations PROPR1, PROPR2 and PROPR3 are performed in the same pattern. In some example embodiments, the repeated patrol read operations may be performed in different patterns.

FIG. 4B illustrates timings of the one patrol read operation PROPRi. The patrol read operation may be suspended while the access operation to the semiconductor memory device is performed (i.e., during the normal mode NMD), and, in some embodiments, the patrol read operation may be performed only during the test mode TMD. The pointer PADD indicating the address at which the patrol read operation is suspended may be stored in the memory controller. When the test mode TMD is resumed, the patrol read operation may be performed continuously based on the stored pointer PADD.

The patrol read operation may take a long time and cause unnecessary power consumption. According to example embodiments, the power consumption may be reduced and the performance and the reliability of the memory system may be enhanced by replacing the patrol read operation with the refresh operation.

Figure 5:
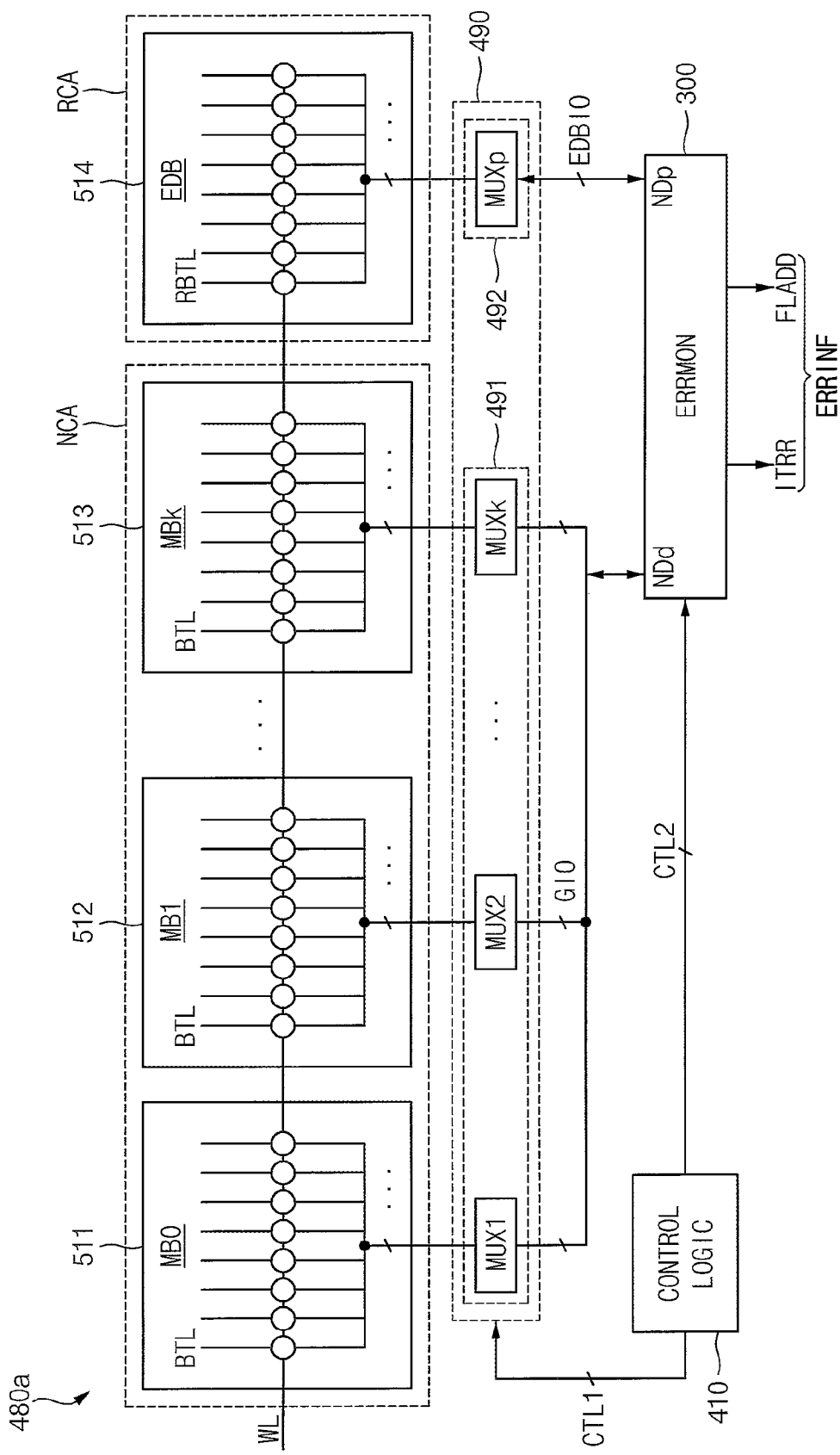
FIG. 5 is a diagram illustrating a portion of a semiconductor memory device according to example embodiments.

FIG. 5 is a diagram illustrating a portion of a semiconductor memory device according to example embodiments. The first bank arrays 480a may be representative of the first through eighth bank arrays 480a to 480h in FIG. 3A.

Referring to FIG. 5, a semiconductor memory device 400a may include a control logic 410, a first bank array 480a, an I/O gating circuit 490, and an error monitoring circuit ERRMON 300. The first bank array 480a may include a normal cell array NCA and a redundancy cell array RCA. The normal cell array NCA may include a plurality of first memory blocks MB0~MBk, e.g., 511~513, and the redundancy cell array RCA may include at least a second memory block EDB, e.g., 514. The first memory blocks 511~513 are memory blocks configured for determining a memory capacity of the semiconductor memory device 400a. The second memory block 514 is for ECC and/or redundancy repair. Because the second memory block 514 for ECC and/or redundancy repair is used for ECC, data line repair, or block repair to repair one or more failed cells generated in the first memory blocks 511~513, the second memory block 514 is also referred to as an EDB block.

In each of the first memory blocks 511~513, a plurality of first memory cells are arrayed in rows and columns. In the second memory block 514, a plurality of second memory cells are arrayed in rows and columns.

In each of the first memory blocks 511~513 and the second memory block 514, rows may be formed of word lines WL, and columns may be formed of bit lines BTL. The first memory cells and the second memory cells connected to intersections of the word lines WL and the bit lines BTL may be dynamic memory cells, such as DRAM cells.

The I/O gating circuit 490 may include a first switching circuit 491 connected to the first memory blocks 511~513 and a second switching circuit 42 connected to the second memory block 514. The first switching circuit 491 and the second switching circuit 492 may include multiplexers or column selectors MUX1~MUXk and MUXp. In the semiconductor memory device 400a, bit lines corresponding to data of a burst length (BL) may be simultaneously accessed to support the BL indicating the maximum number of column positions that is accessible. For example, the BL may be set to 8. In this case, each of the bit lines BTL and RBTL may be connected to a corresponding one of column selectors MUX1~MUXk and MUXp.

The error monitoring circuit 300 may be connected to the first and second switching circuits 491 and 492 through first data lines GIO and second data lines EDBIO, respectively. The first data lines GIO may be connected to data nodes NDd of the error monitoring circuit 300 and the second data lines EDBIO may be connected to parity nodes NDp of the error monitoring circuit 300.

The control logic circuit 410 may be configured to provide control signals CTL1 and CTL2 to control the I/O gating circuit 490 and the error monitoring circuit 300. Based on the control signals CTL1 and CTL2, the refresh sensing data RSDT from the first bank array 480a may be provided to the error monitoring circuit 300, by units of codeword. In addition, the error monitoring circuit 300 may be configured to receive the refresh address RFADD corresponding to the present refresh sensing data RSDT from the refresh controller 100 in FIG. 3A. The error monitoring circuit 300 may be configured to detect the error in the refresh sensing data RSDT and provide the error information ERRINF including the interrupt signal ITRR and the fail address FLADD.

Figure 6:
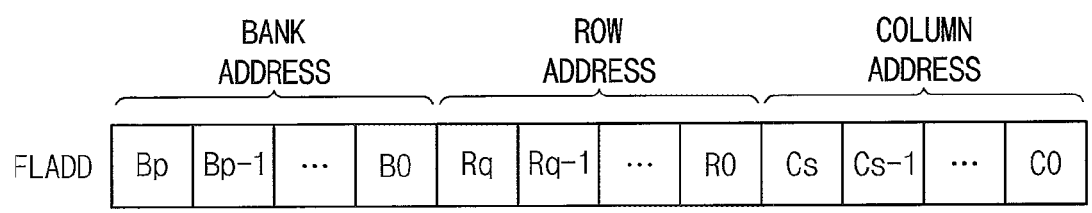
FIG. 6 is a diagram illustrating an example embodiment of a fail address for a method of operating a memory system according to example embodiments.

FIG. 6 is a diagram illustrating an example embodiment of a fail address for a method of operating a memory system according to example embodiments.

Referring to FIG. 6, the fail address FLADD included in the error information ERRINF may include a bank address, a row address, and a column address that indicate a location of the codeword including the error. The refresh sensing data RSDT corresponding to one row address may include a plurality of codewords, and the column address may indicate the position of the codeword including the error in each row.

The bank address may include one or more address bits Bp~B0, the row address may include a plurality of address bits Rq~R0 and the column address may include a plurality of address bits Cs~C0. The bit numbers (p, q, r) of the fail address FLADD may be determined variously according to configuration and memory capacity of the semiconductor memory device. When the semiconductor memory device has a single-bank structure, the fail address FLADD may include the row address and the column address without the bank address.

Figure 7:
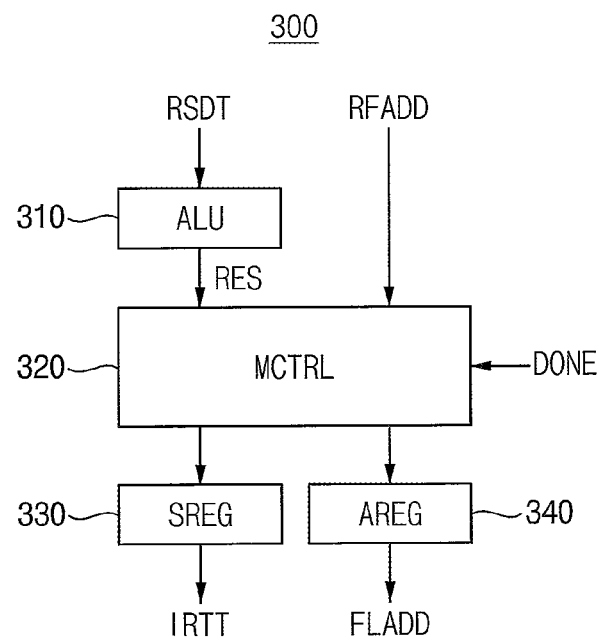
FIG. 7 is a block diagram illustrating an example embodiment of an error monitoring circuit included in a semiconductor memory device according to example embodiments.

FIG. 7 is a block diagram illustrating an example embodiment of an error monitoring circuit included in a semiconductor memory device according to example embodiments.

Referring to FIG. 7, an error monitoring circuit 300 may include a logic operation circuit ALU 310, a monitoring control logic MCTRL 320, a state register SREG 330 and a position register AREG 340.

The logic operation circuit 310 may be configured to perform a logic operation on a codeword included in the refresh sensing data RSDT to generate an operation result value RES. In some example embodiments, as will be described below with reference to FIGS. 9A and 9B, the logic operation circuit 310 may include a plurality of exclusive OR (XOR) logic gates configured to perform an XOR logic operation on bits of the codeword to generate the operation result value RES.

The state register 330 may be configured to store a state bit and generate the interrupt signal IRTT corresponding to the state bit. The position register 340 may store the fail address FLADD and output the fail address FLADD.

The monitoring control logic 320 may be configured to control the state register 330 and the position register 340 based on the operation result value RES.

In some example embodiments, the monitoring control logic 320 may be configured to set the state bit in the state register 330 to a first value (e.g., a value of 1) to activate the interrupt signal ITRR when the operation result value RES indicates an error of the codeword. In addition, the monitoring control logic 320 may be configured to store the fail address FLADD in the position register 340 based on the refresh address RFADD provided from the refresh controller when the operation result value RES indicates an error of the codeword.

In some example embodiments, the monitoring control logic 320 may be configured to receive a correction done signal DONE from the memory controller indicating that error correction of the data stored at the fail address FLADD in the memory cell array is completed. The monitoring control logic 320 may be configured to initialize the state bit in the state register 330 from the first value (e.g., a value of 1) to a second value (e.g., a value of 0) to deactivate the interrupt signal ITRR when the correction done signal DONE is activated.

Figures 8, 9A:
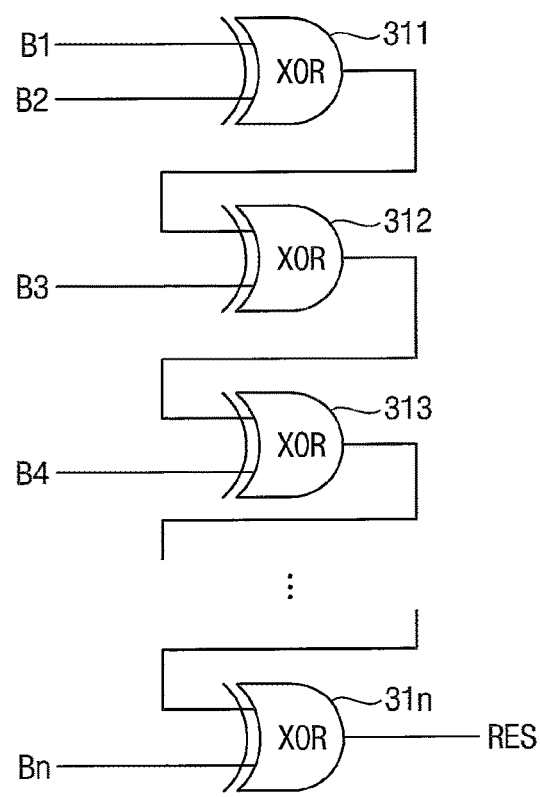
FIG. 8 is a table of ECC levels applicable to a memory system according to example embodiments.
FIGS. 9A and 9B are diagrams illustrating example embodiments of a logic operation circuit included in the error monitoring circuit of FIG. 7.

FIG. 8 is a table of ECC levels applicable to a memory system according to example embodiments.

In FIG. 8, SEC represents single error correction, DED represents double error detection, and DEC represents double error correction. FIG. 8 illustrates parity bits and corresponding size overheads of the parity bits (PARITY O/H). The parity bits correspond to a Hamming code or an extended Hamming code. The size overhead of the parity bits correspond to a ratio of the parity bits of the parity data corresponding to the write data to the data bits of the write data. The values in FIG. 8 are non-limiting examples. For example, the parity bit number and the size overhead may be determined differently if Bose-Chaudhuri-Hocquenghem (BCH) code, Reed-Solomon code, etc. are used.

As illustrated in FIG. 8, as the parity bit number is increased with respect to the same data bit number, e.g., as the ratio of the parity bit number to the data bit number is increased, a capability of error detection and correction is increased. As the data bit number is increased with respect to the same capability of error detection and correction, the corresponding parity bit number is increased but the ratio of the parity bit number to the data bit number is decreased.

As such, the error detection capability and/or the error correction capability may be increased as the ratio of the parity bit number to the corresponding data bit number is increased. As a result, the ECC level may be raised as the ratio of the parity bit number to the corresponding data bit number is increased.

If the ECC level is set to be higher, the memory resource for the ECC scheme may be consumed excessively and the size of the semiconductor memory device may be increased. In contrast, if the ECC level is set to be lower, the capability of error detection and correction may be reduced and the performance of the semiconductor memory device may be degraded. In some example embodiments, the ECC level may be applied differently depending on the degree of importance of the write data to optimize the ECC efficiency.

In the ECC level of SEC, the data and parity structure may be represented by Expression 1.

$$m(x) \cdot x^n + r(x) = q(x) \cdot g(x) \quad \text{Expression 1}$$

In Expression 1, m(x), q(x), g(x) and r(x) are functions that are determined by the ECC scheme. For SEC, only one equation may be used and one minimal polynomial may be used as the generator polynomial g(x).

In the ECC level of SEC-DED, the data and parity structure may be represented by Expression 2.

$$m(x) \cdot x^{n+1} + r(x) = q(x) \cdot g'(x)$$

$$g'(x) = g(x) \cdot (x+1) \quad \text{Expression 2}$$

To further detect one more bits with SEC, an addition polynomial may be added to the generator polynomial g(x). For example, the simplest polynomial (x+1) may be multiplied with the generator polynomial g(x) as represented by Expression 2.

In general, the (n+1)-bit error detection may be implemented by multiplying (x+1) with a generator polynomial for the n-bit error correction. Using such principle, one bit error may be detected by performing an XOR logic operation on each codeword of the refresh sensing data RSDT.

For example, in the case of 156-bit data and 17-bit parity, an example embodiment of the generator polynomial g(x) may be represented as Expression 3.

$$g(x) = x^{15} + x + 1$$

$$g'(x) = (x^{15} + x + 1) \cdot (x+1) = x^{16} + x^{15} + x^2 + 1$$

$$m(x) \cdot x^{17} + r(x) = q(x) \cdot (x^{15} + x + 1) \cdot (x+1) \quad \text{Expression 3}$$

Detailed descriptions for the generator polynomial g(x) may be omitted because the generator polynomial g(x) is for error correction, and only the term (x+1) for one bit error detection will be described with an example.

An 8-bit data 0110_1000 may be represented by $x^6 + x^5 + x^3$. If the parity (x+1) is multiplied with the 8-bit data 0110_1000, the transferred data parity or the codeword becomes $(x^6 + x^5 + x^3)(x+1) = x^7\ x^5\ x^4 + x^3$, where the term $x^6$ having the coefficient of 2 is removed. When (x+1) is multiplied, the number of the entire terms becomes an even number, and thus the value of the codeword becomes 0 when x is set to 1. As a result, if the value of the codeword is 1, it may be determined that the codeword includes a one-bit error.

Figure 9B:
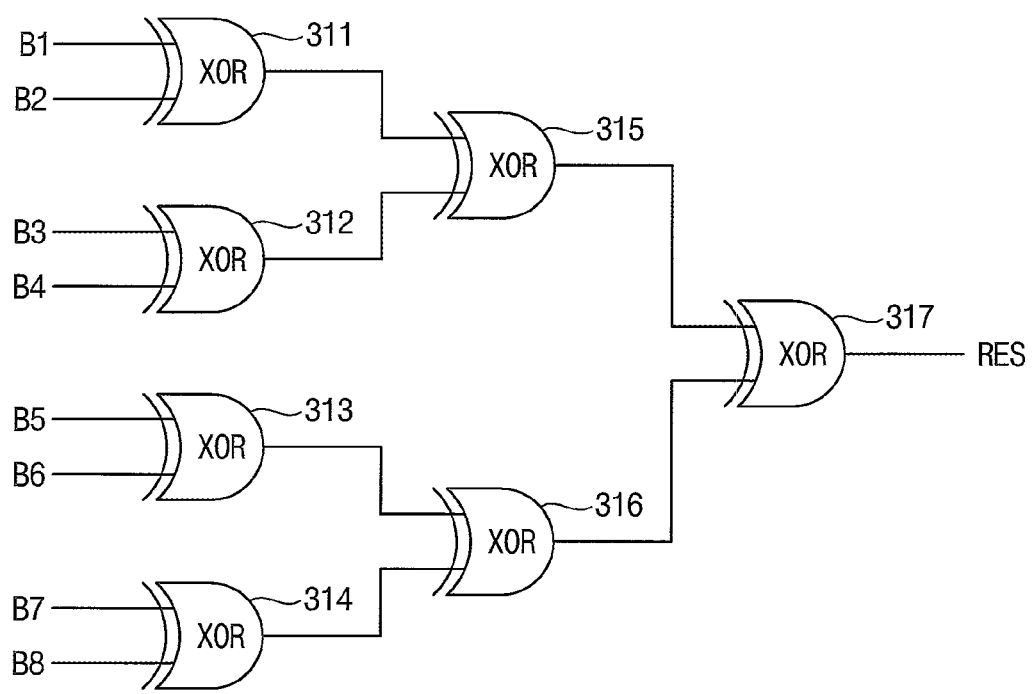

FIGS. 9A and 9B are diagrams illustrating example embodiments of a logic operation circuit included in the error monitoring circuit of FIG. 7.

Referring to FIG. 9A, a logic operation circuit 310a may include a plurality of XOR logic gates 311~314 configured to perform XOR logic operations on bits B1~Bn of the codeword in the refresh sensing data RSDT to generate the operation result value RES.

Referring to FIG. 9B, a logic operation circuit 310b may include a plurality of XOR logic gates 311~317 configured to perform XOR logic operations on bits B1~B8 of the codeword in the refresh sensing data RSDT to generate the operation result value RES.

FIG. 9A illustrates an example configuration for performing the XOR operations in a sequential structure and FIG. 9B illustrates an example configuration for performing the XOR operations in a hierarchical structure. The XOR logic operations on the bits of the codeword may be implemented variously and not limited to the example embodiments of FIGS. 9A and 9B.

Through such XOR logic operations on the bits of the codeword, the operation result value RES may be 1 when the bits of the codeword include an odd number of 1's whereas the operation result value RES may be 0 when the bits of the codeword include an even number of 1's. As described above, it may be determined that the codeword includes an error when the operation result value corresponds to 1.

Figure 10:
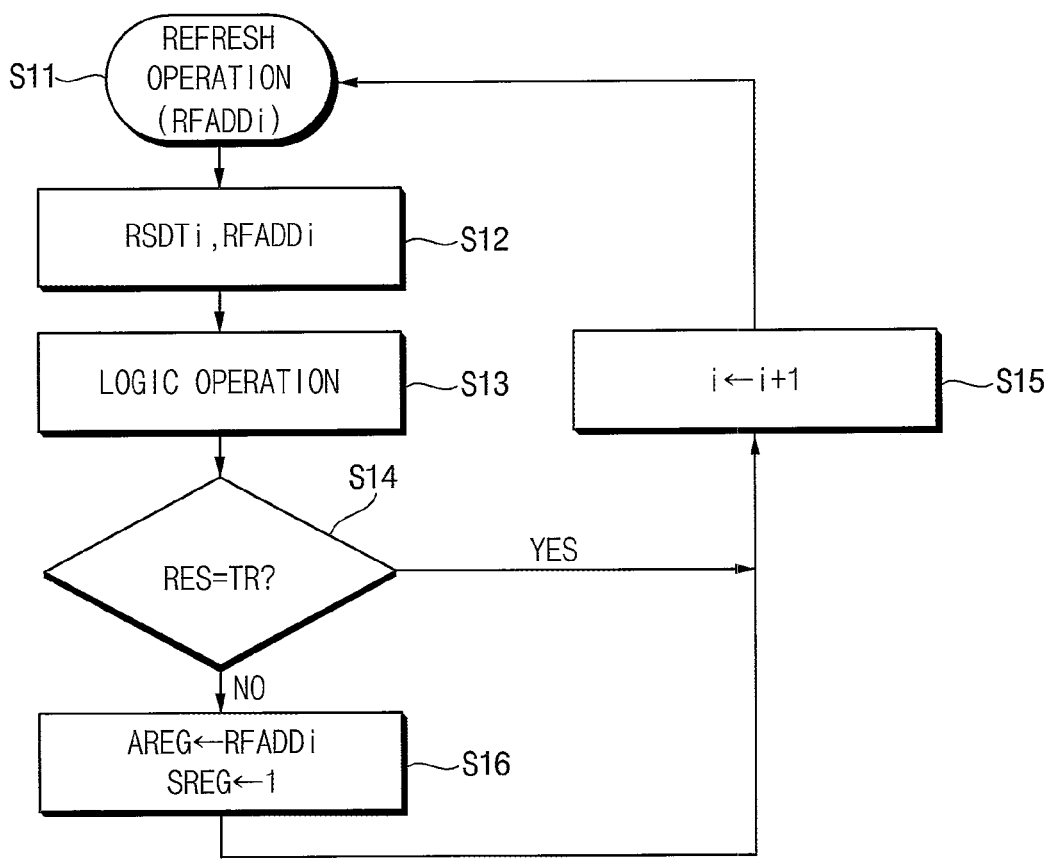
FIGS. 10, 11 and 12 are flowcharts illustrating a method of operating a memory system according to example embodiments.
Figure 11:
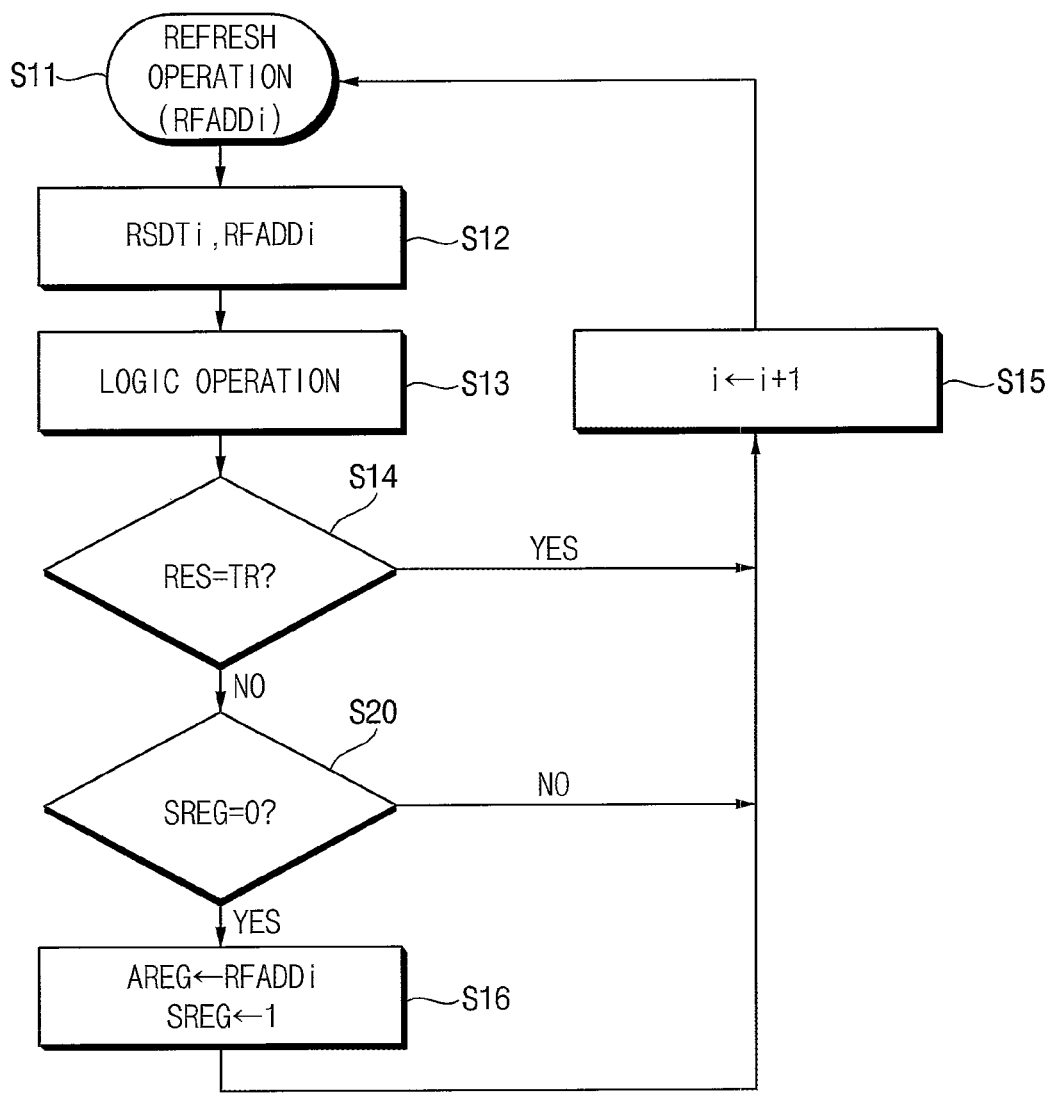
Figure 12:
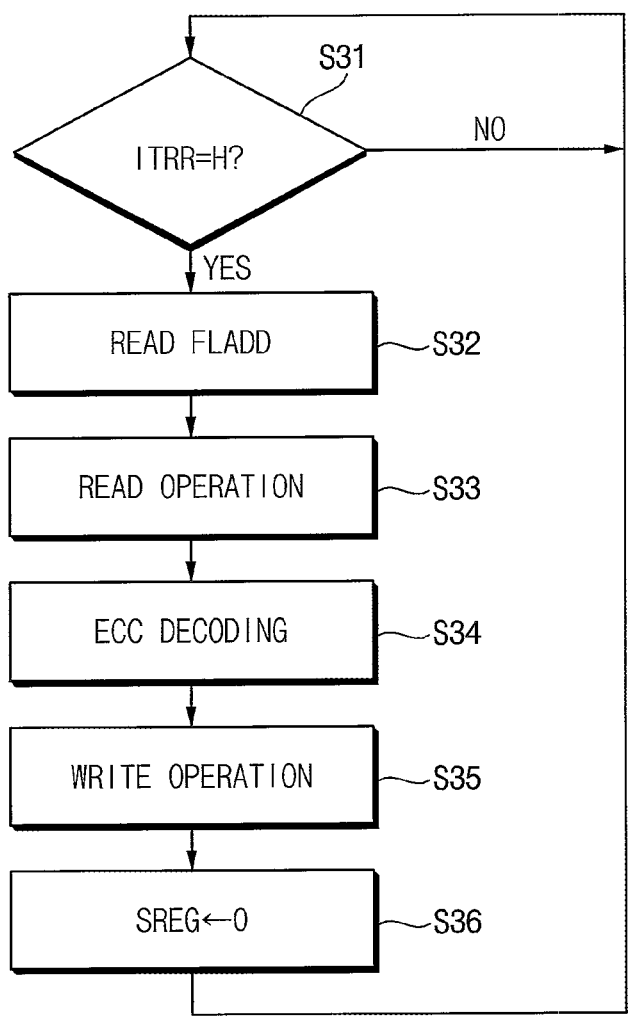

FIGS. 10, 11 and 12 are flowcharts illustrating a method of operating a memory system according to example embodiments.

FIGS. 10 and 11 illustrate example embodiments of detecting an error using the error monitoring circuit.

Referring to FIG. 10, the semiconductor memory device may perform the refresh operation with respect to the memory cells of the refresh address RFADDi (S11). The error monitoring circuit may receive the refresh address RFADDi and the corresponding refresh sensing data RSDTi (S12). The error monitoring circuit may perform the logic operation on the refresh sensing data RSDTi to generate the operation result value (RES) (S13).

When the operation result value RES is a truth value TR (S14: YES), the semiconductor memory device may change the refresh address RFADDi (e.g., increase the refresh address by one) (S14), and repeat the operations S11, S12 and S13. In some example embodiments, as described above, the error monitoring circuit may perform the XOR logic operations on the bits of each codeword in the refresh sensing data RSDTi to generate the operation result value RES, and the truth value TR may correspond to 0.

When the operation result value RES is not the truth value TR (S14: NO), the error monitoring circuit may store the fail address FLADD in the position register AREG based on the refresh address RFADDi and set the state bit of the state register SREG to a first value (e.g., the value of 1) (S16). After that, the semiconductor memory device may change the refresh address RFADDi (S14), and repeat the operations S11, S12 and S13.

A method of FIG. 11 is similar to the method of FIG. 10, and the repeated descriptions are omitted. Referring to FIG. 11, the error monitoring circuit may store the fail address FLADD in the position register AREG based on the refresh address RFADDi and set the state bit in the state register SREG to the first value (e.g., the value of 1) (S16), when the operation result value RES is not the truth value TR (S14: NO) and when the state bit in the state register SREG is a second value (e.g., the value of 0) (S20: YES). In other words, even though the operation result value RES is not the truth value (S14: NO), the error monitoring circuit may not store the refresh address RFADDi corresponding to the codeword including an error as the fail address FLADD, if the state bit in the state register SREG is already set to the first value (S20: NO).

As a result, a plurality of fail addresses may be stored in the position register AREG in the example embodiment of FIG. 10, whereas only one fail address may be stored in the position register AREG in the example embodiment of FIG. 11. The error correction for the fail address that is not stored in the position register AREG even though the fail address corresponds to an error case may be performed later by the repeatedly performed refresh operation.

FIG. 12 illustrates an example embodiment of error correction using the memory controller. Referring to FIG. 12, when the interrupt signal ITRR transferred from the error monitoring circuit in the semiconductor memory device is activated (e.g., in the logic high level H) (S31: YES), the memory controller may access the error monitoring circuit to receive the fail address FLADD (S32). The memory controller may read the data including the error from the memory cell array based on the fail address FLADD (S33). The memory controller may generate corrected data by correcting the data including the error using the ECC circuit (S34) and write the corrected data in the memory cell array based on the fail address FLADD (S35).

After the error correction is completed, the memory controller may activate the correction done signal DONE. Responding to the activation of the correction done signal DONE, the error monitoring circuit may initialize the state bit in the state register SREG from the second value (e.g., the value of 0) to the first value (e.g., the value of 1) (S36). In addition, the error monitoring circuit may delete the fail address FLADD corresponding to the completed error correction from the position register AREG.

Figure 13:
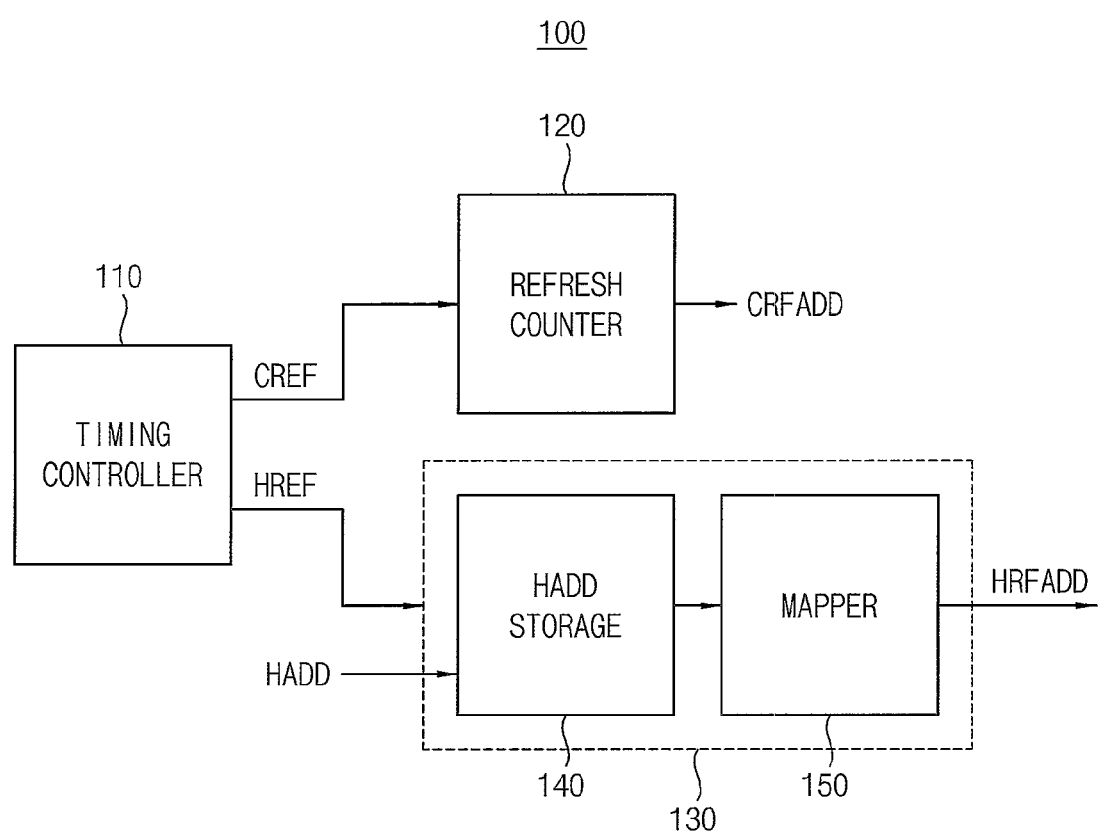
FIG. 13 is a block diagram illustrating a refresh controller included in the semiconductor memory device of FIG. 3A.

FIG. 13 is a block diagram illustrating a refresh controller included in the semiconductor memory device of FIG. 3A.

Referring to FIG. 13, the refresh controller 100 may include a timing controller 110, a refresh counter 120, and an address generator 130.

The timing controller 110 may be configured to generate a counter refresh signal CREF representing a timing of a normal refresh operation and a hammer refresh signal HREF representing a timing of a hammer refresh operation based on operational characteristics of the semiconductor memory device. As will be described below with reference to FIG. 15, the timing controller 110 may be configured to selectively activate one of the counter refresh signal CREF and the hammer refresh signal HREF. In some example embodiments, as illustrated in FIG. 13, the timing controller 110 may be included in the refresh controller 100. According to example embodiments, the timing controller 110 may be omitted, and the counter refresh signal CREF and the hammer refresh signal HREF may be provided from other control logic units in the semiconductor memory device.

The refresh counter 120 may be configured to generate a counter refresh address signal CRFADD in response to the counter refresh signal CREF where the counter refresh address signal CRFADD may represent a sequentially changing address. For example, the refresh counter 120 may be configured to increase a value of the counter refresh address signal CRFADD whenever the counter refresh signal CREF is activated. Wordlines in a memory cell array of the semiconductor memory device may be selected sequentially for refresh operations by increasing the value of the counter refresh address signal CRFADD.

The address generator 130 may be configured to store the hammer address HADD and may be configured to generate a hammer refresh address signal HRFADD in synchronization with the hammer refresh signal HREF, where the hammer refresh address signal HRFADD represents an address of a row that is physically adjacent to the row corresponding to the hammer address HADD. The address generator 130 may include a hammer address storage 140 and a mapper 150. The hammer address HADD may be provided by the memory controller or the semiconductor memory device using various methods.

The hammer address storage 140 may be configured to store the hammer address HADD. The mapper 150 may be configured to generate the hammer refresh address signal HRFADD based on the hammer address HADD provided from the hammer address storage 140. According to example embodiments, the hammer address storage 140 may be omitted and the mapper 150 may receive the hammer address HADD directly from the memory controller. As will be described below with reference to FIG. 14, the hammer refresh address signal HRFADD may indicate an address of the row of the semiconductor memory device that is physically adjacent to the row of the semiconductor memory device corresponding to the hammer address HADD. In some example embodiments, the mapper 150 may provide an address corresponding to one of the two adjacent rows in response to the hammer refresh signal HREF as will be described below with reference to FIG. 15. In other example embodiments, the mapper 150 may be configured to sequentially provide addresses corresponding to the two adjacent rows in response to the hammer refresh signal HREF. In still other example embodiments, the mapper 150 may be configured to provide an address corresponding to one of the four adjacent rows or sequentially provide addresses corresponding to the four adjacent rows in response to the hammer refresh signal HREF.

Figure 14:
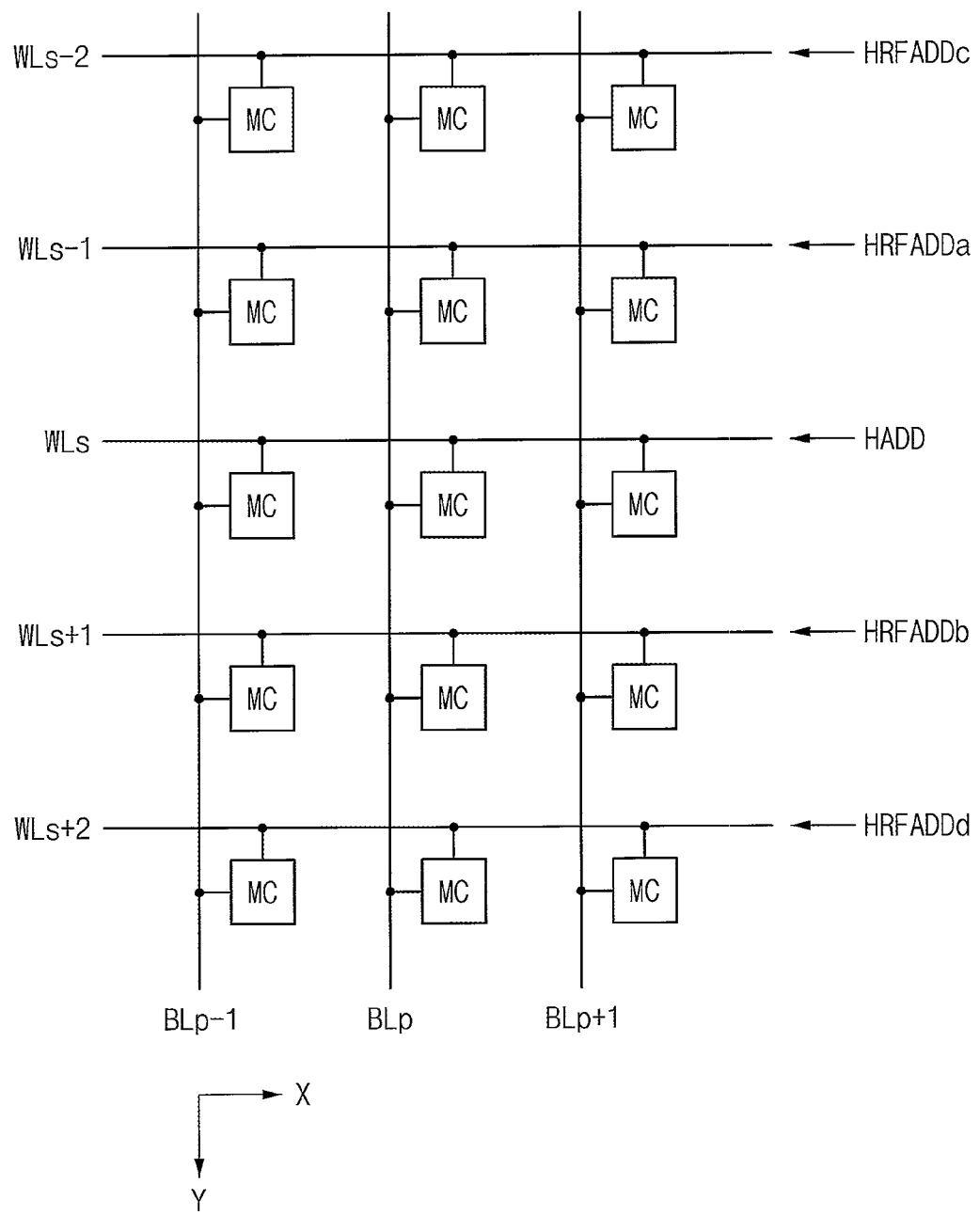
FIG. 14 is a diagram illustrating a portion of a memory cell array for illustrating data loss due to wordline coupling.

FIG. 14 is a diagram illustrating a portion of a memory cell array for describing a data loss due to wordline coupling.

FIG. 14 illustrates five wordlines WLs−2, WLs−1, WLs, WLs+1 and WLs+2, three bitlines BLp−1, BLp and BLp+1 and memory cells MC coupled to the wordlines WLs−2, WLs−1, WLs, WLs+1 and WLs+2 and the bitlines BLp−1, BLp and BLp+1 in the memory cell array. The five wordlines WLs−2, WLs−1, WLs, WLs+1 and WLs+2 extend in a row direction (e.g., X direction) and are arranged sequentially along a column direction (e.g., Y direction). The three bitlines BLp−1, BLp and BLp+1 extend in the column direction and are arranged sequentially along the row direction.

For example, the middle wordline WLs may correspond to the hammer address HADD that has been accessed intensively. It will be understood that an intensively-accessed or hammer wordline refers to a wordline that has a relatively higher activation number and/or has a relatively higher activation frequency (e.g., greater than a predetermined threshold or greater than other access addresses). Whenever the hammer wordline (e.g., the middle wordline WLs) is accessed, the hammer wordline WLs is enabled and precharged, and the voltage level of the hammer wordline WLs is increased and decreased. Wordline coupling may cause the voltage levels of the adjacent wordlines WLs−2, WLs−1, WLs+1 and WLs+2 to fluctuate as the voltage level of the hammer wordline WLs varies. Thus, the cell charges of the memory cells MC coupled to the adjacent wordlines WLs−2, WLs−1, WLs+1 and WLs+2 may be affected. As the hammer wordline WLs is accessed more frequently, the cell charges of the memory cells MC coupled to the adjacent wordlines WLs−2, WLs−1, WLs+1, and WLs+2 may be lost more rapidly.

The address generator 130 in FIG. 13 may provide the hammer refresh address signal HRFADD representing addresses HRFADDa, HRFADDb, HRFADDc and HRFADDd of the rows (e.g., the wordlines WLs−1, WLs+1, WLs−2, and WLs+2) that are physically adjacent to the row of the hammer address HADD (e.g., the middle wordline WLs), and a hammer refresh operation for the adjacent wordlines WLs−1, WLs+1, WLs−2, and WLs+2 may be performed based on (e.g., in response to) the hammer refresh address signal HRFADD to reduce or possibly prevent the loss of data stored in the memory cells MC. The hammer refresh operation may be performed with respect to the two wordlines WLs−1 and WLs+1 directly adjacent to the hammer wordline WLs or with respect to the four wordlines WLs−2, WLs−1, WLs+1 and WLs+2 including the next adjacent wordlines WLs−2 and WLs+2.

Figure 15:
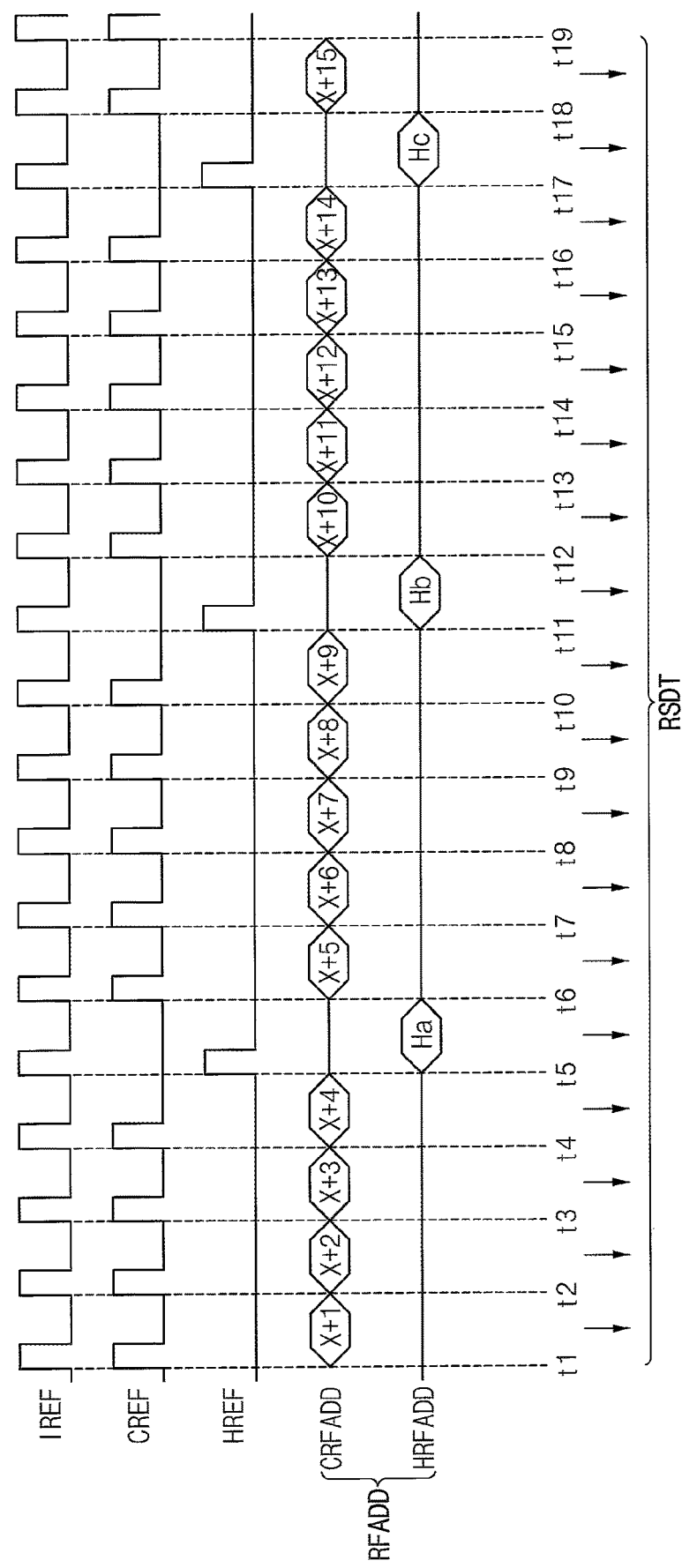
FIG. 15 is a timing diagram illustrating example operations of a refresh controller included in a semiconductor memory device according to example embodiments.

FIG. 15 is a timing diagram illustrating example operations of a refresh controller included in a semiconductor memory device according to example embodiments.

FIG. 15 illustrates generation of the counter refresh signal CREF, the hammer refresh signal HREF, the counter refresh address signal CRFADD, and the hammer refresh address signal HRFADD, with respect to a refresh signal IREF that is activated with a pulse shape. The intervals between activation time points t1~t19 of the refresh signal IREF may be regular or irregular.

Referring to FIGS. 13 and 15, the timing controller 110 may be configured to activate the counter refresh signal CREF in synchronization with time points t1~t4, t6~t10, t12~t16, and t18~t19 among the activation time points t1~t19 of the refresh signal IREF, and may be configured to activate the hammer refresh signal HREF in synchronization with the time points t5, t11 and t17. Even though FIG. 15 illustrates that the counter refresh signal CREF is activated five times for each activation of the hammer refresh signal HREF, the activation ratio of the counter refresh signal CREF and the hammer refresh signal HREF may be changed.

The refresh counter 120 may be configured to generate the counter refresh address signal CRFADD representing the sequentially changing addresses X+1~X+15 in synchronization with the activation time points t1~t4, t6~t10, t12~t16 and t18~t19 of the counter refresh signal CREF. The address generator 130 may be configured to generate the hammer refresh address signal HRFADD representing the address Ha, Hb, and Hc of the rows that are physically adjacent to the row of the hammer address HADD in synchronization with the activation time points t5, t11, and t17 of the hammer refresh signal HREF.

As illustrated in FIG. 15, the address generator 130 may be configured to provide an address corresponding to one of the two adjacent rows. For example, the address Ha may be less than the hammer address HADD by 1 at the time point t5, and the address Hb may be greater than the hammer address HADD by 1 at the time point t11. As such, the address generator 130 may be configured to alternately provide the smaller address or the larger address with respect to the hammer address signal at each activation time point of the hammer refresh signal HREF.

As such, the refresh address RFADD may include the counter refresh address CRFAD and the hammer refresh address HRFADD. The corresponding refresh sensing data RSDT may be provided per refresh address RFADD. When an error is detected in the refresh sensing data RSDT, the fail address FLADD may be determined based on the corresponding refresh address RFADD.

Figure 16:
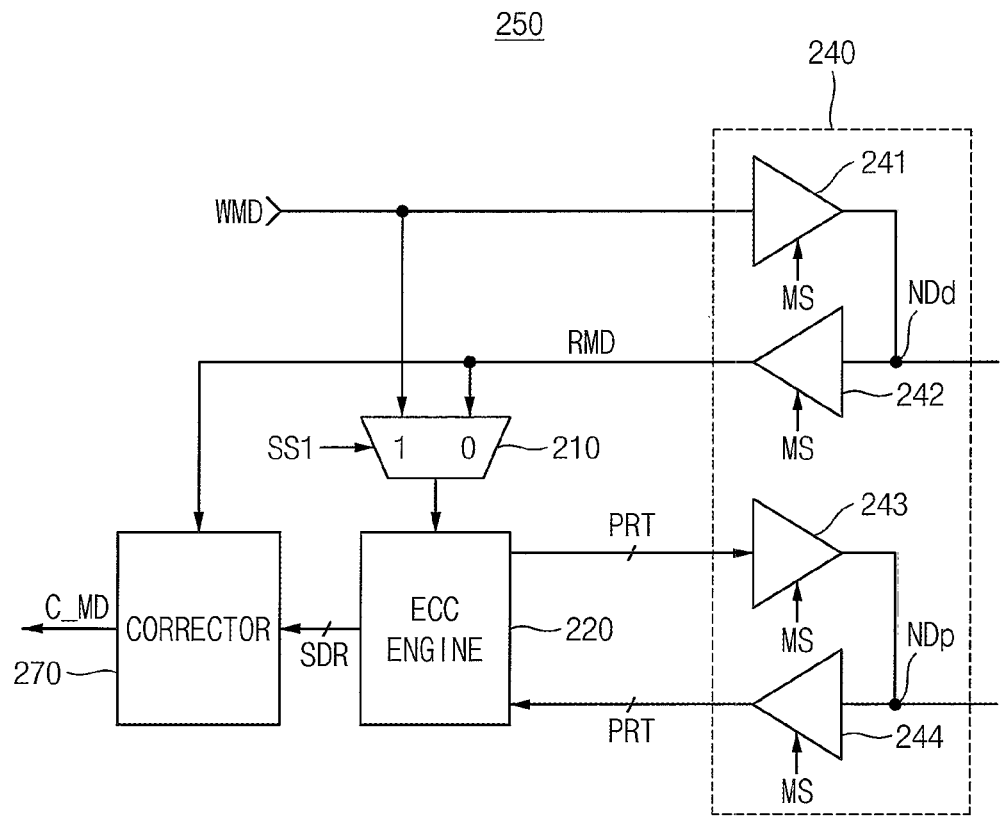
FIG. 16 is a diagram illustrating an example embodiment of an error correction code (ECC) circuit included in a memory system according to example embodiments.

FIG. 16 is a diagram illustrating an example embodiment of an error correction code (ECC) circuit included in a memory system according to example embodiments.

Referring to FIG. 16, the ECC circuit 250 may include a multiplexer 210, an ECC engine 220, a buffer unit 240, and a data corrector 270. The buffer unit 240 may include first through fourth buffers 241~244.

The multiplexer 210, in a write operation of the semiconductor memory device, may be configured to provide write data WMD to the ECC engine 220 in response to a first selection signal SS1. The multiplexer 210, in a read operation of the semiconductor memory device, may be configured to provide read data RMD from the buffer 242 to the ECC engine 220 in response to the first selection signal SS1.

The buffers 241 and 243 may be enabled in the write operation in response to a mode signal MS and may be configured to provide the write data WMD and parity data PRT to the I/O gating circuit 490 in FIG. 5 through data nodes NDd and parity nodes NDp, respectively. The buffers 242 and 244 may be enabled in the read operation in response to the mode signal MS, the buffer 242 may be configured to provide the read data RMD to the multiplexer 210 and the data corrector 270 through the data nodes NDd, and the buffer 414 may be configured to provide the parity data PRT to the ECC engine 220 through the parity nodes NDp.

The ECC engine 220, in the write operation, may be configured to perform an ECC encoding on the write data WMD to provide the parity data PRT to the buffer 243. The ECC engine 220, in the read operation, may be configured to perform an ECC decoding on the read data RMD from the multiplexer 210 based on the parity data PRT from the buffer 244 to provide syndrome data SDR to the data corrector 270.

The data corrector 270 may be configured to correct an error bit in the read data RMD based on the syndrome data SDR from the ECC engine 220 to provide a corrected main data C_MD.

Figure 17:
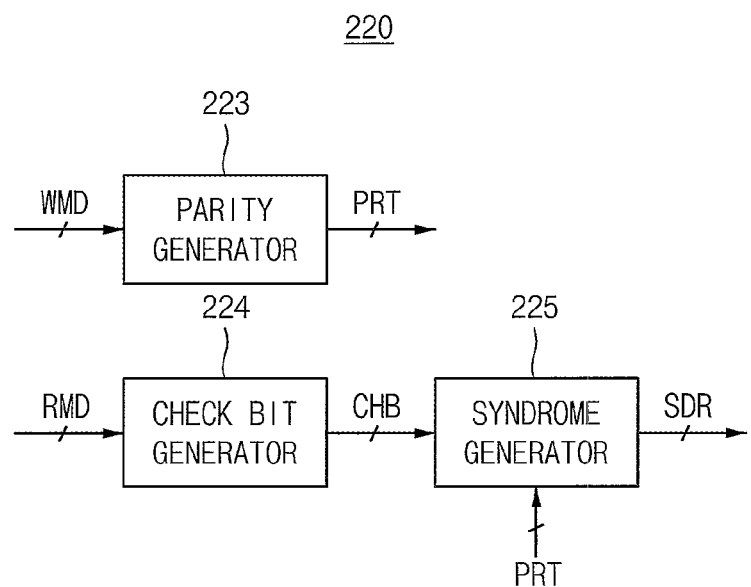
FIG. 17 is a diagram illustrating an example embodiment of an ECC engine included in the ECC circuit of FIG. 16.

FIG. 17 is a diagram illustrating an example embodiment of an ECC engine included in the ECC circuit of FIG. 16.

Referring to FIG. 17, the ECC engine 220 may include a parity generator 223, a check bit generator 224, and a syndrome generator 225.

The parity generator 223 may be configured to generate the parity data PRT based on the write data WMD using an array of exclusive OR gates. The parity generator 223 may include a plurality of sub generators that may be configured to operate as a whole or individually, as will be described below with reference to FIG. 18.

The check bit generator 224 may be configured to generate check bits CHB based on the read main data RMD. The check bit generator 224 may include a plurality of sub generators that operate as a whole or individually.

The syndrome generator 225 may be configured to generate the syndrome data SDR based on the check bits CHB and the parity data PRT from the buffer 244. The syndrome generator 225 may include a plurality of sub generators. A number of the sub generators, which are activated, may be reconfigurable (adjustable or changeable) depending on the assigned ECC level.

Figure 18:
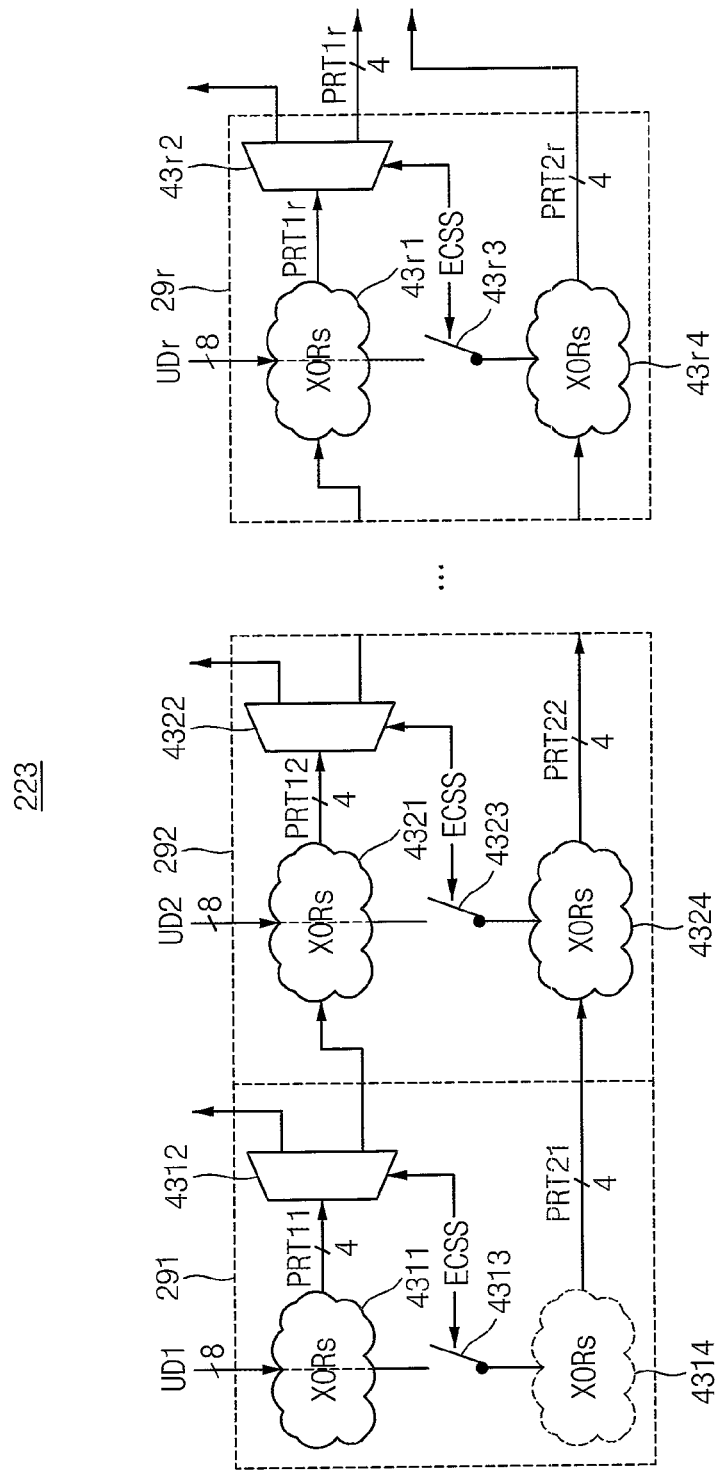
FIG. 18 is a diagram illustrating an example embodiment of a parity generator included in the ECC engine of FIG. 17.

FIG. 18 is a diagram illustrating an example embodiment of a parity generator included in the ECC engine of FIG. 17.

Referring to FIG. 18, the parity generator 223 may include a plurality of parity sub generators 291~29r, where r is a natural number greater than two.

The parity sub generators 291~29r may be connected to one another and operate as a whole or in concert with one another in a first engine configuration mode, or may be separated from one another and operate individually in a second engine configuration mode.

Each of the parity sub generators 291~29r may include a corresponding one of a first set of XOR modules 4311~43r1, a corresponding one of demultiplexers 4312~43r2, a corresponding one of switches 4313~43r3, and a corresponding one of a second set of XOR modules 4314~43r4.

Each of the first set of XOR modules 4311~43r1 may be configured to perform an XOR operation on a corresponding one of sub data UD1~UDr, which constitute the main data MD (e.g., write data WMD) and may be configured to generate a corresponding one of first partial parity data PRT11~PRT1r. Each of the switches 4313~43r3 may be connected between a corresponding one of the first set of XOR modules 4311~43r1 and a corresponding one of the second set of XOR modules 4314~43r4, may be configured to provide a corresponding one of sub data UD1~UDr to a corresponding one of the second set of XOR modules 4314~43r4 in the first engine configuration mode, and may be opened in the second configuration mode, in response to the engine configuration selection signal ECSS. The second set of XOR modules 4314~43r4 may be sequentially connected to one another in the first engine configuration mode. Each of the second set of XOR modules 4314~43r4 may be configured to perform an XOR operation on a corresponding one of the sub data UD1~UDr and may be configured to generate a corresponding one of second partial parity data PRT21~PRT2r sequentially.

Each of the demultiplexers 4312~43r2 may be configured to provide a corresponding one of the first partial parity data PRT11~PRT1r to a first path in the first engine configuration mode when a relatively high ECC level is assigned, and may be configured to provide a corresponding one of the first partial parity data PRT11~PRT1r to a second path in the second engine configuration mode when a relatively low ECC level is assigned, in response to the engine configuration selection signal ECSS. In the first engine configuration mode, the parity sub generators 291~29r may be sequentially connected to one another through the first path of each of the parity sub generators 291~29r. In the second engine configuration mode, the parity sub generators 291~29r may be separated from one another and provide the first partial parity data PRT11~PRT1r individually.

Figure 19:
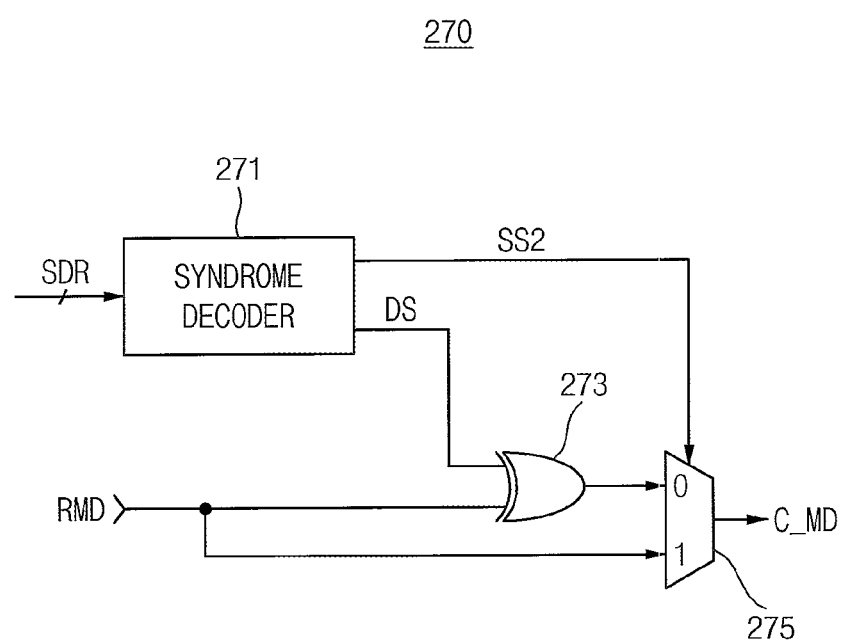
FIG. 19 is a diagram illustrating a data corrector included in the ECC circuit of FIG. 16.

FIG. 19 is a diagram illustrating a data corrector included in the ECC circuit of FIG. 16.

Referring to FIG. 19, the data corrector 270 may include a syndrome decoder 271, a bit inverter 273, and a selection circuit 275, which is implemented by a multiplexer.

The syndrome decoder 271 may be configured to decode the syndrome data SDR to generate a decoding signal DS and a second selection signal SS2. The decoding signal DS may indicate a position of at least one error bit and the second selection signal SS2 may have a logic level based on a number of the at least one error bit. The bit inverter 273 may be configured to invert the at least one error bit in response to the decoding signal DS. The selection circuit 275 may be configured to select one of the read data RMD and an output of the bit inverter 273 to provide the corrected main data C_MD in response to the second selection signal SS2.

The syndrome decoder 271 may be configured to output the second selection signal SS2 with a first logic level (e.g., logic high level) when a number of the at least one error bit in the read data RMD exceeds the error correction capability of the ECC based on the syndrome data SDR. The selection circuit 275 may be configured to provide the read data RMD as the corrected main data C_MD in response to the second selection signal SS2 having the first logic level. The syndrome decoder 271 may be configured to output the decoding signal DS with the first logic level and output the second selection signal SS2 with a second logic level (e.g., logic low level) when a number of the at least one error bit in the read data RMD is within the error correction capability of the ECC based on the syndrome data SDR. The bit inverter 273 may be configured to invert the at least one error bit in response to the decoding signal DS having the first logic level. The selection circuit 275 may be configured to provide the output of the bit inverter 273 as the corrected main data C_MD in response to the second selection signal SS2 having the second logic level.

The components described with reference to FIGS. 16 through 19 may have a fixed configuration or a variable configuration according to a structure of a memory cell array for applying the ECC levels in accordance with different embodiments.

As described with reference to FIGS. 7 through 9B, the error monitoring circuit 300 may have a relatively simple configuration, that is, a relatively small size and a relatively low power consumption because the error monitoring circuit may be configured to perform a relatively simple logic operation to detect the error occurrence. In contrast, as described with reference to FIGS. 16 through 19, the ECC circuit 250 may have a relatively complex configuration, that is, a relatively large size and a relatively high power consumption because the ECC circuit 250 may be configured to perform a relatively complex logic operation for the error correction.

According to example embodiments, the semiconductor memory device may be responsible for the error detection using the error monitoring circuit 300, whereas the memory controller may be responsible for the error correction using the ECC circuit 250. The power consumption of the memory system may be reduced and the performance and the reliability of the memory system may be enhanced by replacing a conventional patrol read operation with a refresh operation that is performed inevitably in a semiconductor memory device, such as a dynamic memory device.

Figure 20:
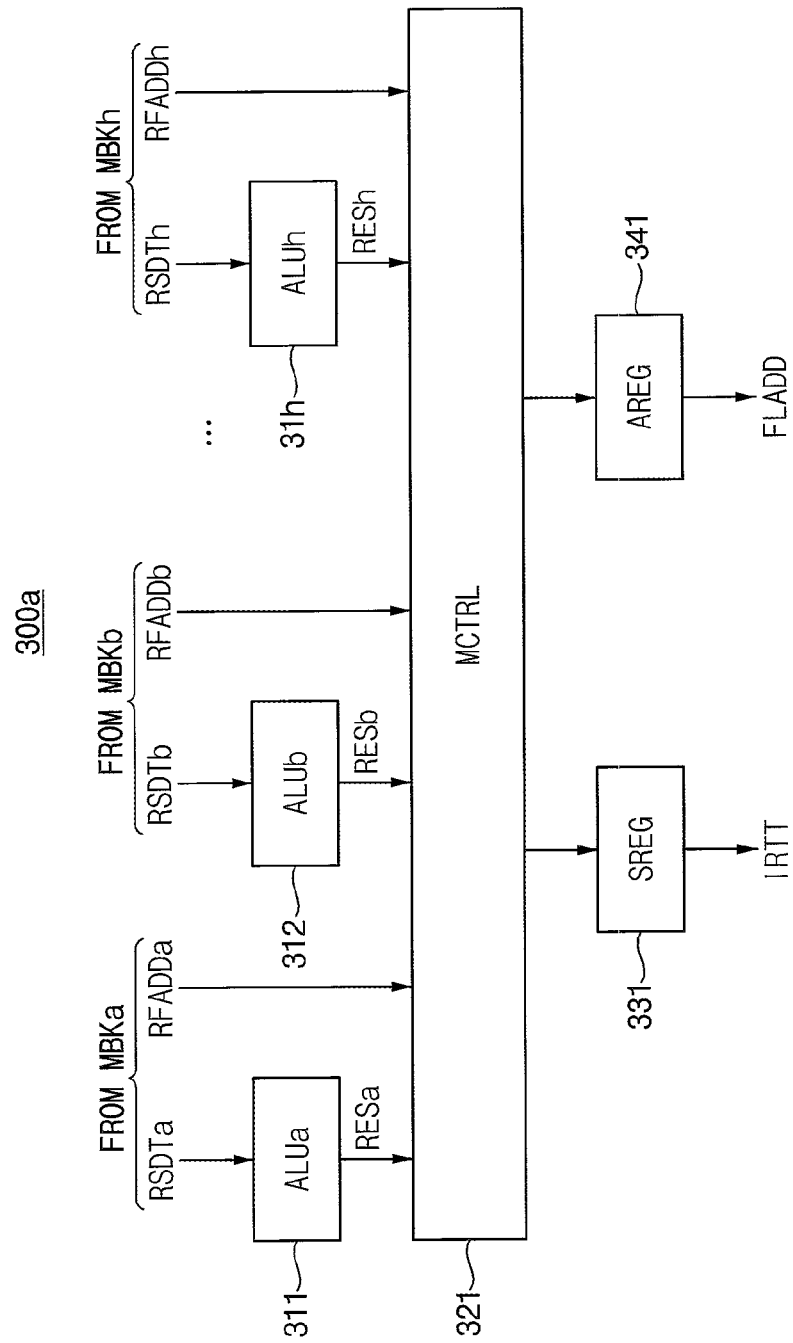
FIG. 20 is a block diagram illustrating an example embodiment of an error monitoring circuit included in a semiconductor memory device according to example embodiments.

FIG. 20 is a block diagram illustrating an example embodiment of an error monitoring circuit included in a semiconductor memory device according to example embodiments. FIG. 20 illustrates an example embodiment in which a semiconductor memory device includes a plurality of bank arrays.

Referring to FIG. 20, an error monitoring circuit 300a may include a plurality of logic operation circuits ALUa~ALUh 311~31h, a monitoring control logic MCTRL 321, a state register SREG 331, and a position register AREG 341.

The plurality of logic operation circuits 311~31h may be configured to perform logic operations on codewords included in the refresh sensing data RSDTa~RSDTh provided from the plurality of bank arrays MBKa~MBKh to generate a plurality of operation result values RESa~RESh, respectively.

The state register 331 may be configured to store a state bit and generate the interrupt signal IRTT corresponding to the state bit. The position register 341 may be configured to store the fail address FLADD and output the fail address FLADD. The monitoring control logic 321 may be configured to control the state register 331 and the position register 341 based on the plurality of operation result values RESa~RESh.

FIG. 20 illustrates a non-limiting example embodiment in which each logic operation circuit is dedicated to each bank array. In some example embodiments, the monitoring control logic 321, the state register 331, and/or the position register 341 may include a plurality of unit circuits respectively dedicated to the plurality of bank arrays.

Figure 21:
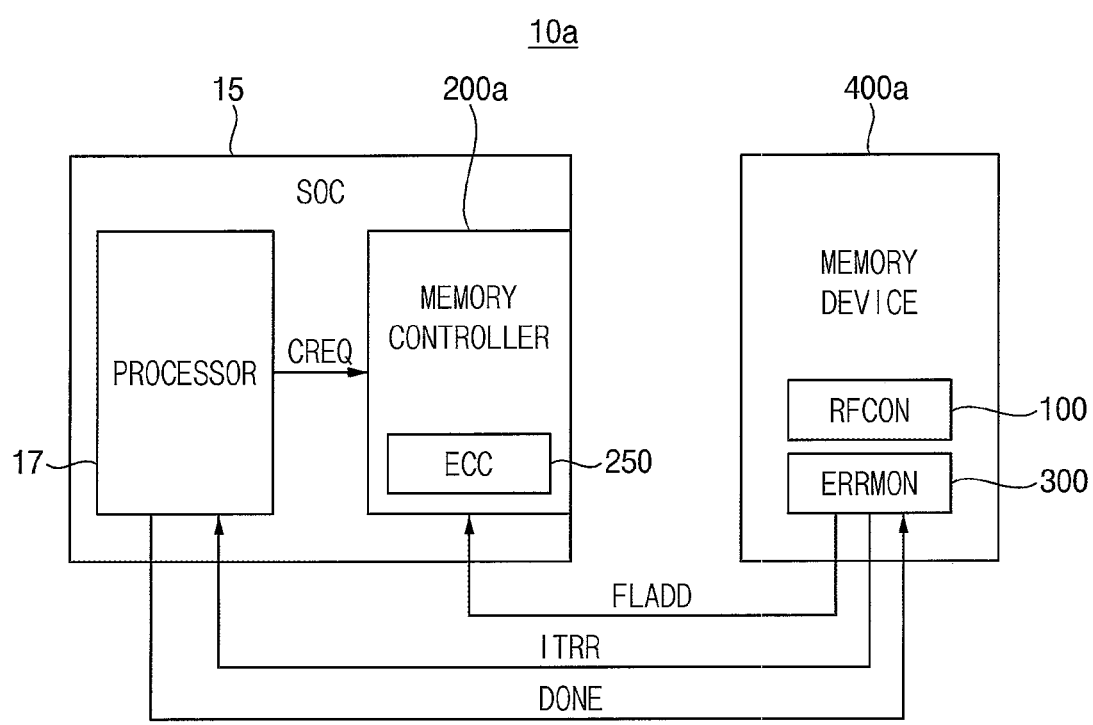
FIG. 21 is a block diagram illustrating a memory system according to example embodiments.

FIG. 21 is a block diagram illustrating a memory system according to example embodiments.

Referring to FIG. 21, a memory system 10a may include a host device 15 and a semiconductor memory device 400a. As described above, the semiconductor memory device 400a may include a memory cell array, a refresh controller RFCON 100 and an error monitoring circuit ERRMON 300.

The host device 15 may include a processor 17 and a memory controller 200a configured to control the semiconductor memory device 400a. The host device 15 may be a system on chip (SoC) or an application processor (AP), which includes various function blocks.

As described above, the error monitoring circuit 300 in the semiconductor memory device 400a may be configured to generate the interrupt signal ITRR indicating whether the error occurred in the data stored in the memory cell array, and the fail address FLADD indicating the location of the error in the data stored in the memory cell array, i.e., an address in the memory where the data having the error is located.

The memory controller 200a in the host device 15 may include the ECC circuit 250, and may be configured to correct the error in the data stored in the memory cell array using the ECC circuit 250 based on the interrupt signal ITRR and the fail address FLADD.

In some example embodiments, the processor 17 in the host device 15 may receive the interrupt signal ITRR from the error monitoring circuit 300 in the semiconductor memory device 400a and transfer a correction request CREQ to the memory controller 200a when the interrupt signal ITRR is activated.

The memory controller 200a may be configured to perform the error correction in response to the correction request CREQ. In other words, the memory controller 200a may be configured to access the semiconductor memory device 400a to receive the fail address FLADD in response to the correction request CREQ. The memory controller 200a may be configured to read the data including the error from the memory cell array based on the fail address FLADD. The memory controller 200a may be configured to generate corrected data by correcting the data including the error using the ECC circuit 250, and may be configured to write the corrected data in the memory cell array based on the fail address FLADD. After the error correction is completed, the processor 17 may be configured to activate the correction done signal DONE.

Figure 22:
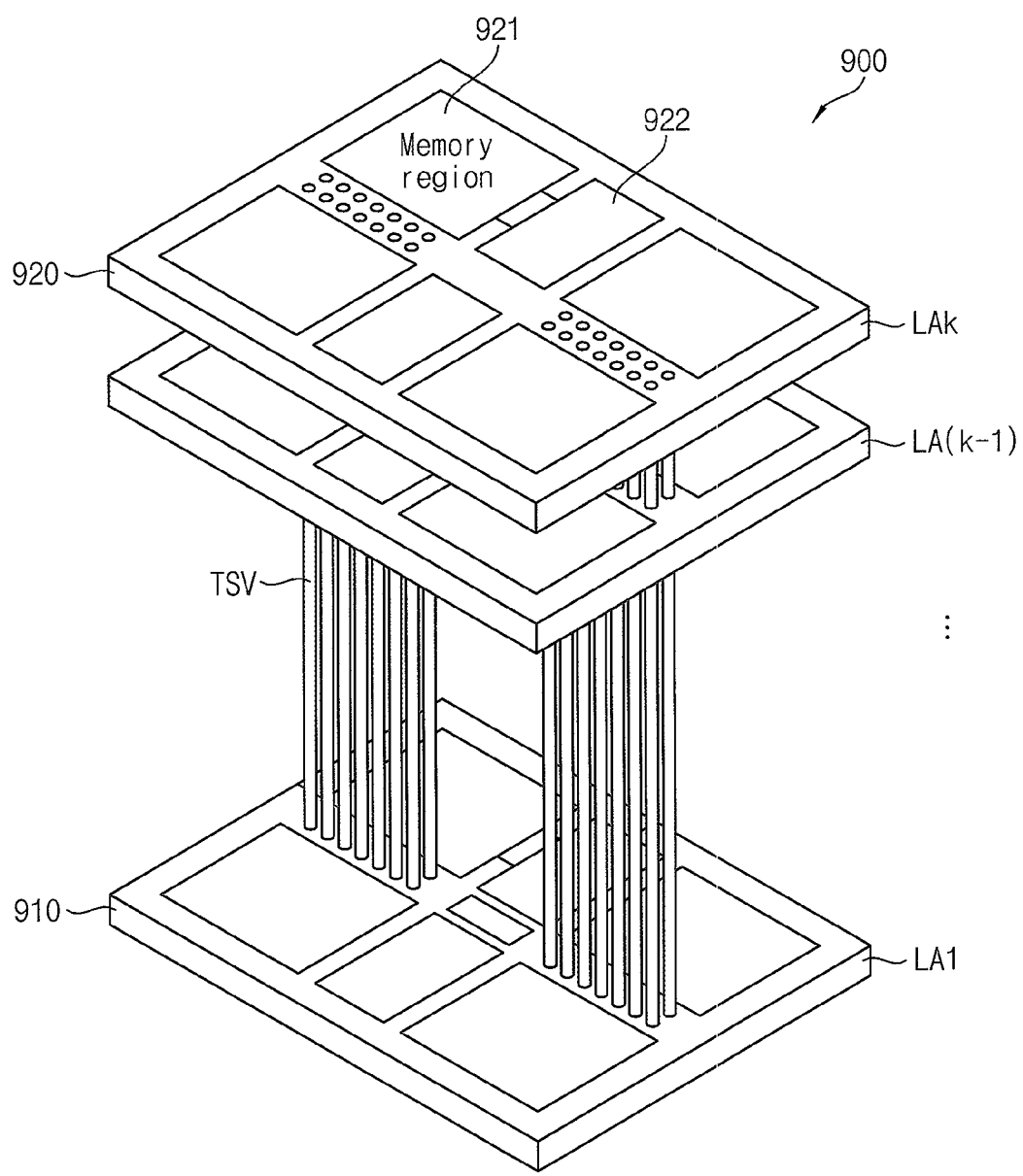
FIGS. 22 and 23 are diagrams illustrating a stacked semiconductor memory device according to example embodiments.
Figure 23:
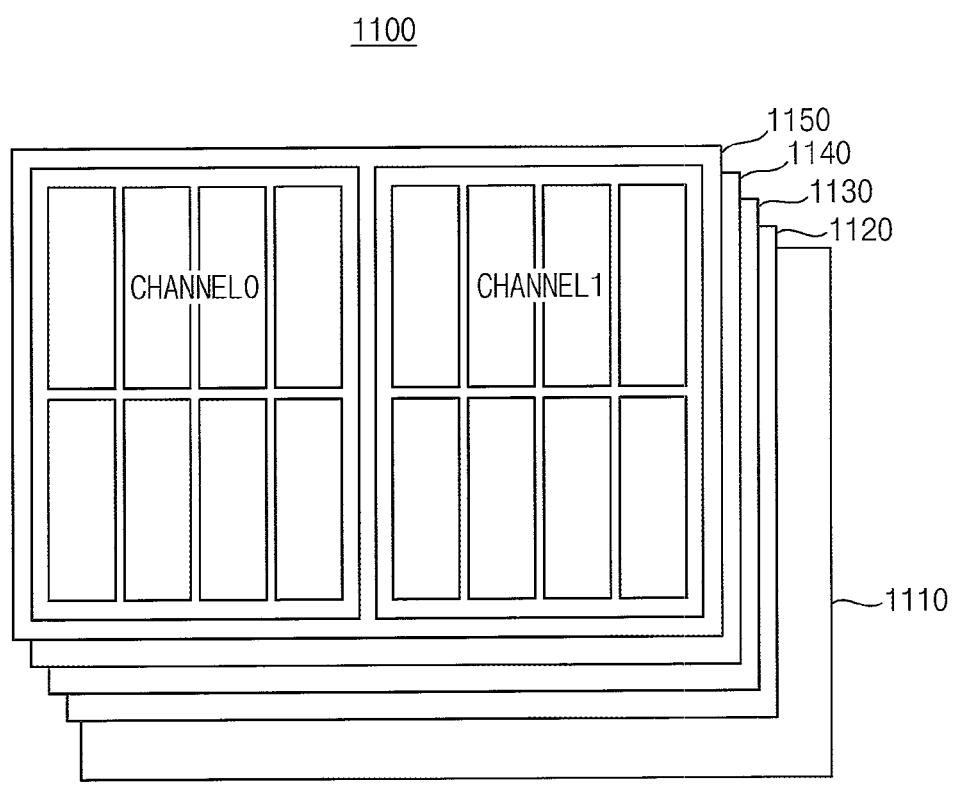

FIGS. 22 and 23 are diagrams illustrating a stacked semiconductor memory device according to example embodiments.

Referring to FIG. 22, a semiconductor memory device 900 may include first through kth semiconductor integrated circuit layers LA1 910 through LAk 920, in which the lowest, first semiconductor integrated circuit layer LA1 is assumed to be an interface or control chip, and the other semiconductor integrated circuit layers LA2 through LAk are assumed to be slave chips including core memory chips. The slave chips may form a plurality of memory ranks as described above.

The first through kth semiconductor integrated circuit layers LA1 through LAk may be configured to transmit and receive signals between the layers by through-substrate vias TSVs (e.g., through-silicon vias). The lowest first semiconductor integrated circuit layer LA1, as the interface or control chip, may be configured to communicate with an external memory controller through a conductive structure formed on an external surface.

Each of the first semiconductor integrated circuit layer LA1 910 through the kth semiconductor integrated circuit layer LAk 920 may include memory regions 921 and peripheral circuits 922 for driving the memory regions 921. For example, the peripheral circuits 922 may include a row-driver for driving wordlines of a memory, a column-driver for driving bit lines of the memory, a data input-output circuit for controlling input-output of data, a command buffer for receiving a command from an outside source and buffering the command, and an address buffer for receiving an address from an outside source and buffering the address.

The first semiconductor integrated circuit layer LA1 910 may further include a control circuit. The control circuit may be configured to control access to the memory region 921 based on a command and an address signal from a memory controller and may be configured to generate control signals for accessing the memory region 921.

Each of the semiconductor integrated circuit layers LA2 through LAk corresponding to the slave layers may include a refresh controller and an error monitoring circuit as described above.

FIG. 23 illustrates an example high bandwidth memory (HBM) organization according to some embodiments. Referring to FIG. 23, a HBM 1100 may have a stack of multiple DRAM semiconductor dies 1120, 1130, 1140, and 1150. The HBM of the stack structure may be optimized by a plurality of independent interfaces, i.e., channels. Each DRAM stack may support up to 8 channels in accordance with HBM standards. FIG. 23 shows an example stack containing 4 DRAM semiconductor dies 1120, 1130, 1140, and 1150, and each DRAM semiconductor die supports two channels CHANNEL0 and CHANNEL 1.

Each channel provides access to an independent set of DRAM banks. Requests from one channel may not access data attached to a different channel. Channels are independently clocked, and need not be synchronous.

The HBM 1100 may further include an interface die 1110 or a logic die at the bottom of the stack structure to provide signal routing and other functions. Some functions for the DRAM semiconductor dies 1120, 1130, 1140, and 1150 may be implemented in the interface die 1110.

Each of the DRAM semiconductor dies 1120, 1130, 1140, and 1150 may include a refresh controller and an error monitoring circuit as described above.

Figure 24:
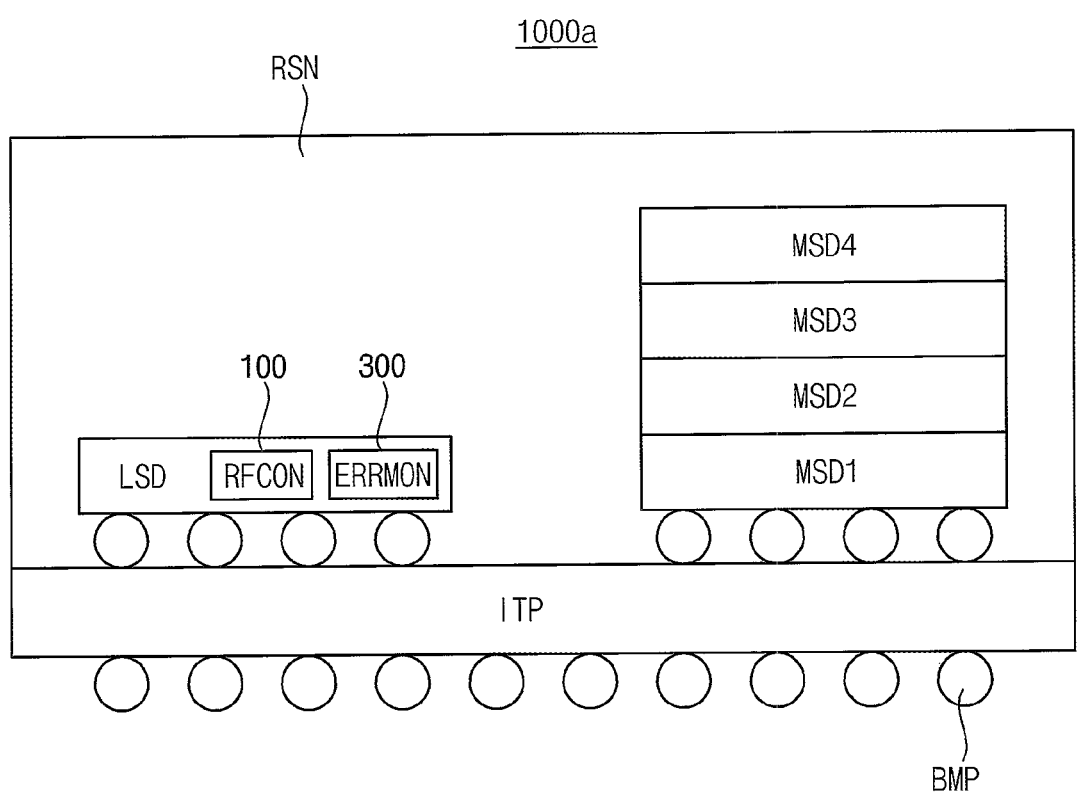
FIGS. 24 and 25 are diagrams illustrating packaging structures of a stacked semiconductor memory device according to example embodiments.
Figure 25:
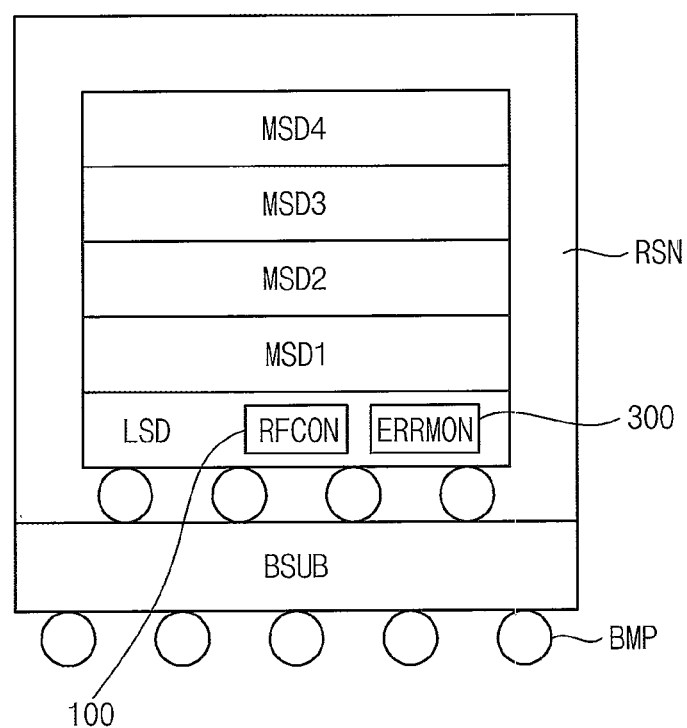

FIGS. 24 and 25 are diagrams illustrating packaging structures of a stacked semiconductor memory device according to example embodiments.

Referring to FIG. 24, a memory device 1000a may be a memory package, and may include a base substrate or an interposer ITP and a stacked memory device stacked on the interposer ITP. The stacked memory device may include a logic semiconductor die LSD (or a buffer semiconductor die) and a plurality of memory semiconductor dies MSD1, . . . , MSD4.

Referring to FIG. 25, a memory device 1000b may be a memory package and may include a base substrate BSUB and a stacked memory device stacked on the base substrate BSUB. The stacked memory device may include a logic semiconductor die LSD and a plurality of memory semiconductor dies MSD1, . . . , MSD4.

FIG. 24 illustrates a structure in which the memory semiconductor dies MSD1, . . . , MSD4, except for the logic semiconductor die LSD, are stacked vertically and the logic semiconductor die LSD is electrically connected to the memory semiconductor dies MSD1, . . . , MSD4 through the interposer ITP or the base substrate. In contrast, FIG. 25 illustrates a structure in which the logic semiconductor die LSD is stacked vertically with the memory semiconductor dies MSD1, . . . , MSD4.

A refresh controller RFCON 100 and an error monitoring circuit ERRMON 300 as described above may be disposed in the logic semiconductor die LSD. In some example embodiments, the refresh controller 100 and the error monitoring circuit ERRMON 300 may be included in each of the memory semiconductor dies MSD1, . . . , MSD4.

The base substrate BSUB may be the same as the interposer ITP or include the interposer ITP. The base substrate BSUB may be a printed circuit board (PCB). External connecting elements, such as conductive bumps BMP, may be formed on a lower surface of the base substrate BSUB and internal connecting elements, such as conductive bumps, may be formed on an upper surface of the base substrate B SUB. In some example embodiments, the semiconductor dies LSD and MSD1, . . . , MSD4 may be electrically connected through through-silicon vias. In other example embodiments, the semiconductor dies LSD and MSD1, . . . , MSD4 may be electrically connected through the bonding wires. In still other example embodiments, the semiconductor dies LSD and MSD1, . . . , MSD4 may be electrically connected through a combination of the through-silicon vias and the bonding wires. In the example embodiment of FIG. 24, the logic semiconductor die LSD may be electrically connected to the memory semiconductor dies MSD1, . . . , MSD4 through conductive line patterns formed in the interposer ITP. The stacked semiconductor dies LSD and MSD1, . . . , MSD4 may be packaged using an encapsulant such as resin RSN.

Figure 26:
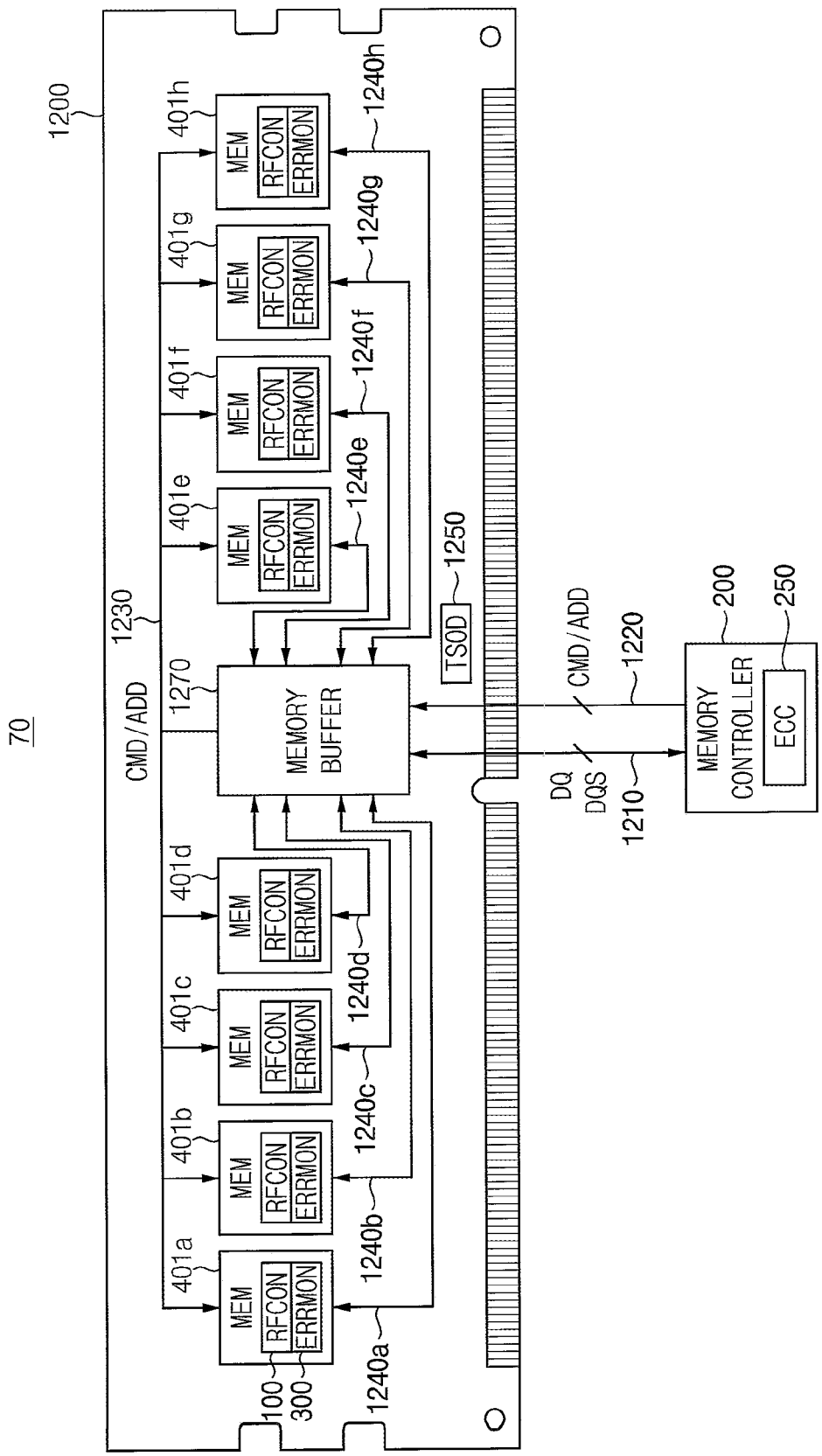
FIG. 26 is a diagram illustrating a memory system according to example embodiments.

FIG. 26 is a diagram illustrating a memory system according to example embodiments.

As illustrated in FIG. 26, a memory system 70 may include a memory module 1200 and a memory controller 200. The memory module 1200 may include a module substrate and a plurality of memory chips 401*a*, 401*b*, 401*c*, 401*d*, 401*e*, 401*f*, 401*g*, 401*h* and a module sensor TSOD 1250 that are mounted on the module substrate. FIG. 26 illustrates a non-limiting example of eight memory chips 401*a*, . . . , 401*h*, however the number of memory chips included in the memory module 1200 may be determined variously in accordance with different embodiments.

The memory module 1200 may be connected to the memory controller 200 via a data bus 1210 and a control bus 1220. The memory module 1200 may be inserted into a socket connector of a larger memory system or computational system. Electrical connectors (or pins) of the memory module 1200 may be connected to electrical contacts of the socket connector. The electrical connectors and the buses 1210 and 1220 connected to the electrical contacts may allow direct access to a memory buffer or a buffer chip 1270 and indirect access to the memory chips 401*a*, . . . , 401*h* of the memory module 1200. The data bus 1210 may include signal lines (conductive wiring) to transfer data signals DQ and data strobe signals DQS, and the control bus 1220 may include at least one of a command (CMD) line and/or address (ADD) line.

The data bus 1210 and control bus 1220 are directly connected to the buffer chip 1270 via the respective socket/pin and bus signal line arrangements. In turn, the buffer chip 1270 is connected to the respective memory chips 401*a*, . . . , 401*h* via at least a commonly-connected first bus 1230 and separately connected second buses 1240*a*, 1240*b*, 1240*c*, 1240*d*, 1240*e*, 1240*f*, 1240*g*, 1240*h* from specified ports of the buffer chip 1270 to corresponding ports of the memory chips 401*a*, . . . , 401*h*. The buffer chip 1270 may be used to transfer a received command and/or address received from the memory controller 200 via the control bus 1220 to the respective memory chips 401*a*, . . . , 401*h* via the first bus 1230.

The buffer chip 1270 may be configured to transfer write data DQ (i.e., data to be written to one or more of the memory chips 400*a*, . . . , 400*h*) and the data strobe signal DQS received from the memory controller 200 via the data bus 1210 to the memory chips 401*a*, . . . , 401*h* via the respective second buses 1240*a*, . . . , 1240*h*. The buffer chip 1270 may be further configured to transfer read data DQ (data retrieved from one or more of the memory chips 401*a*, . . . , 401*h*) obtained from one or more of the memory chips 401*a*, . . . , 401*h* via the second buses 1240*a*, . . . , 1240*h* to the memory controller 200 via the data bus 1210.

Each of the memory chips 401*a*, . . . , 401*h* may include a refresh controller RFCON 100 and an error monitoring circuit ERRMON 300 as described above. The memory controller 200 may include an ECC circuit 250.

Figure 27:
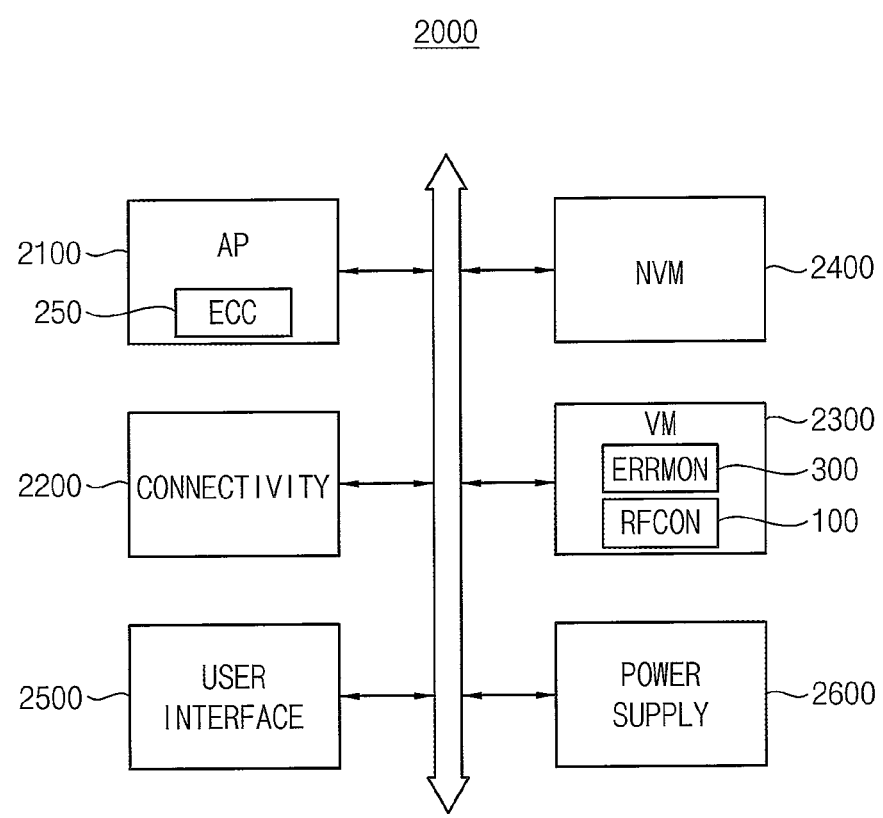
FIG. 27 is a block diagram illustrating a mobile system including a semiconductor memory device according to example embodiments.

FIG. 27 is a block diagram illustrating a mobile system including a semiconductor memory device according to example embodiments.

Referring to FIG. 27, a mobile system 2000 may include an application processor (AP) 2100, a connectivity unit 2200, a volatile memory device (VM) 2300, a nonvolatile memory device (NVM) 2040, a user interface 2500, and a power supply 2600. In some embodiments, the mobile system 2000 may be, for example, a mobile phone, a smart phone, a personal digital assistant (PDA), a portable multimedia player (PMP), a digital camera, a music player, a portable game console, a navigation system, or another type of electronic device.

The application processor 2100 may be configured to execute applications, e.g., a web browser, a game application, a video player, and so on. The connectivity unit 2200 may be configured to perform wired or wireless communication with an external device. The volatile memory device 2300 may be configured to store data processed by the application processor 2100 or may be configured to operate as a working memory. The nonvolatile memory device 2400 may be configured to store a boot image for booting the mobile system 2000. The user interface 2500 may include at least one input device, such as a keypad, a touch screen, etc., and at least one output device, such as a speaker, a display device, etc. The power supply 2600 may be configured to supply a power supply voltage to the mobile system 1200.

As described above, the volatile memory device 2300 may include a refresh controller RFCON 100 and an error monitoring circuit ERRMON 300 as described above. The application processor 2100 may include an ECC circuit 250.

As described above, the memory system and the method of operating the memory system, according to example embodiments, may remove the patrol read operation accompanied with memory scrubbing by generating the error information in the semiconductor memory device based on the refresh sensing data that is provided during the refresh operation and performing the error correction by the memory controller based on the error information. Through the removal of the patrol read operation, the power consumption of the memory system may be reduced and reliability and performance of the memory system may be enhanced.

Embodiments described herein may be applied to a semiconductor memory device and systems including a semiconductor memory device. For example, embodiments may be applied to systems, such as a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive device, etc.

As described above, example embodiments may provide a memory device and a memory system capable of efficiently performing a hammer refresh operation. Example embodiments may provide a method of controlling refresh of a memory device capable of efficiently performing a hammer refresh operation.

What is claimed is:

1. A memory system comprising:
    a semiconductor memory device comprising:
        a memory cell array including a plurality of memory cells configured to store data;
        a refresh controller configured to control a refresh operation during a memory refresh maintenance state of the memory cell array with respect to the plurality of memory cells; and
        an error monitoring circuit configured to generate error information by monitoring an error in the data stored in the memory cell array based on refresh sensing data provided from the memory cell array during the refresh operation while the memory cell array is in the memory refresh maintenance state; and
    a memory controller configured to control the semiconductor memory device, the memory controller including an error correction code (ECC) circuit and further configured to receive the error information from the semiconductor memory device and correct the error in the data stored in the memory cell array using the ECC circuit based on the error information.

2. The memory system of claim 1, wherein the error information includes an interrupt signal and a fail address, such that the interrupt signal indicates whether the error occurred in the data stored in the memory cell array and the fail address indicates a location of the error in the data stored in the memory cell array.

3. The memory system of claim 2, wherein the error monitoring circuit is further configured to generate the interrupt signal by performing an exclusive OR (XOR) logic operation on bits of the refresh sensing data.

4. The memory system of claim 2, wherein the memory controller is further configured to access the error monitoring circuit and to receive the fail address responsive to activation of the interrupt signal.

5. The memory system of claim 4, wherein the memory controller is further configured to:
    read the data including the error from the memory cell array based on the fail address;
    generate corrected data by correcting the data including the error using the ECC circuit; and
    write the corrected data in the memory cell array based on the fail address.

6. The memory system of claim 2, wherein the error monitoring circuit includes:
    a logic operation circuit configured to perform a logic operation on a codeword included in the refresh sensing data to generate an operation result value;
    a state register configured to store a state bit and to generate the interrupt signal corresponding to the state bit;
    a position register configured to store the fail address and to output the fail address; and
    a monitoring control logic configured to control the state register and the position register based on the operation result value.

7. The memory system of claim 6, wherein the logic operation circuit includes:
    a plurality of XOR logic gates configured to perform XOR logic operations on bits of the codeword to generate the operation result value.

8. The memory system of claim 6, wherein the monitoring control logic is further configured to set the state bit to a first value to activate the interrupt signal when the operation result value indicates an error of the codeword.

9. The memory system of claim 8, wherein the monitoring control logic is further configured to:
    receive a correction done signal from the memory controller indicating that error correction of the data stored at the fail address of the memory cell array is completed; and
    initialize the state bit from the first value to a second value to deactivate the interrupt signal when the correction done signal is activated.

10. The memory system of claim 6, wherein the monitoring control logic is further configured to store the fail address in the position register based on a refresh address provided from the refresh controller when the operation result value indicates an error of the codeword.

11. The memory system of claim 2, wherein the memory cell array includes a plurality of bank arrays, and
    wherein the error monitoring circuit includes:
        a plurality of logic operation circuits configured to perform logic operations on codewords included in the refresh sensing data provided from the plurality of bank arrays to generate a plurality of operation result values, respectively;
        a state register configured to store a state bit and generate the interrupt signal corresponding to the state bit;
        a position register configured to store the fail address and output the fail address; and
        a monitoring control logic configured to control the state register and the position register based on the plurality of operation result values.

12. The memory system of claim 11, wherein the fail address includes a bank address, a row address and a column address that indicate a location of the respective codeword including the error.

13. The memory system of claim 1, further comprising:
    sense amplifiers coupled to the memory cell array;
    a main interface configured to transfer a command, an access address, and the data stored in the memory cell array between the memory controller and the semiconductor memory device; and
    a side-band interface configured to transfer the error information between the memory controller and the error monitoring circuit and to operate independently of the main interface;
    wherein the error monitoring circuit is configured to receive the refresh sensing data directly from the sense amplifiers.

14. A method of operating a memory system including a semiconductor memory device and a memory controller configured to control the semiconductor memory device, the method comprising:
    performing a refresh operation with respect to a plurality of memory cells included in a memory cell array of the semiconductor memory device while the memory cell array is in a memory refresh maintenance state;

generating, in the semiconductor memory device, error information by monitoring an error in data stored in the memory cell array based on refresh sensing data provided from the memory cell array during the refresh operation;

providing the error information from the semiconductor memory device to the memory controller;

providing the error information from the semiconductor memory device to the memory controller; and correcting the error in the data stored in the memory cell array using an error correction code (ECC) circuit included in the memory controller based on the error information.

15. The method of claim 14, wherein generating the error information includes:

generating an interrupt signal indicating whether the error occurred in the data stored in the memory cell array; and generating a fail address indicating a location of the error in the data stored in the memory cell array.

16. The method of claim 15, wherein generating the interrupt signal includes:

performing an exclusive OR (XOR) logic operation on bits of the refresh sensing data.

17. The method of claim 15, wherein correcting the error in the data stored in the memory cell array includes:

transferring the fail address from the semiconductor memory device to the memory controller responsive to activation of the interrupt signal.

18. The method of claim 17, wherein correcting the error in the data stored in the memory cell array further includes:

reading the data including the error from the memory cell array based on the fail address;

generating corrected data by correcting the data including the error using the ECC circuit; and writing the corrected data in the memory cell array based on the fail address.

19. A memory system comprising:

a semiconductor memory device comprising a memory cell array including a plurality of memory cells configured to store data; and a host device comprising a processor and a memory controller configured to control the semiconductor memory device, wherein the semiconductor memory device is configured to generate an interrupt signal and a fail address by monitoring an error in the data stored in the memory cell array based on refresh sensing data provided from the memory cell array during a refresh operation while the memory cell array is in a memory refresh maintenance state, such that the interrupt signal indicates whether the error occurred in the data stored in the memory cell array and the fail address indicates a location of the error in the data stored in the memory cell array, and wherein the host device includes an error correction code (ECC) circuit, and the host device is configured to receive the error information from the semiconductor memory device and correct the error in the data stored in the memory cell array using the ECC circuit based on the error information.

20. The memory system of claim 19, wherein the processor is configured to receive the interrupt signal from the semiconductor memory device and to transfer a correction request to the memory controller when the interrupt signal is activated, and wherein memory controller is configured to:

access the semiconductor memory device to receive the fail address in response to the correction request;

read the data including the error from the memory cell array based on the fail address;

generate corrected data by correcting the data including the error using the ECC circuit; and write the corrected data in the memory cell array based on the fail address.

\* \* \* \* \*